United States Patent
Khozikov et al.

(10) Patent No.: US 12,107,447 B2
(45) Date of Patent: Oct. 1, 2024

(54) APPARATUS AND METHODS FOR ARC DETECTION, FAULT ISOLATION, AND BATTERY SYSTEM RECONFIGURATION

(71) Applicant: The Boeing Company, Chicago, IL (US)

(72) Inventors: Vyacheslav Khozikov, Bellevue, WA (US); Frederic Lacaux, Woodinville, WA (US); John A. Trela, Seattle, WA (US); Kamiar J. Karimi, Kirkland, WA (US)

(73) Assignee: The Boeing Company, Arlington, VA (US)

( * ) Notice: Subject to any disclaimer, the term of this patent is extended or adjusted under 35 U.S.C. 154(b) by 536 days.

(21) Appl. No.: 17/403,954

(22) Filed: Aug. 17, 2021

(65) Prior Publication Data
US 2023/0059046 A1    Feb. 23, 2023

(51) Int. Cl.
*H02J 7/00*        (2006.01)
*G01R 15/04*       (2006.01)
(Continued)

(52) U.S. Cl.
CPC ............ *H02J 7/0031* (2013.01); *G01R 15/04* (2013.01); *H01M 50/502* (2021.01);
(Continued)

(58) Field of Classification Search
CPC .... H02J 7/0031; H02J 7/0013; H02J 7/00304; H02J 7/0047; H02J 7/0063;
(Continued)

(56) References Cited

U.S. PATENT DOCUMENTS

| | | |
|---|---|---|
| 7,157,710 B1 | 1/2007 | Shannon |
| 7,536,914 B2 | 5/2009 | Land, III et al. |
| 2008/0055800 A1 | 3/2008 | Aiello et al. |
| 2009/0213505 A1 | 8/2009 | Cornelius et al. |
| 2014/0091059 A1 | 4/2014 | Henke |
| 2017/0214258 A1* | 7/2017 | Namou ................. H02J 7/0031 |

FOREIGN PATENT DOCUMENTS

| | | | |
|---|---|---|---|
| CN | 107221718 A | 9/2017 | |
| EP | 2149953 A2 | 2/2010 | |
| EP | 2903057 A1 * | 8/2015 | ........ H01M 10/3909 |

(Continued)

OTHER PUBLICATIONS

Ammerman et al., "DC-Arc Models and Incident-Energy Calculations", IEEE Transactions on Industry Applications, vol. 46, No. 5, Sep./Oct. 2010.

(Continued)

*Primary Examiner* — Zixuan Zhou
(74) *Attorney, Agent, or Firm* — Ostrager Chong Flaherty & Broitman P.C.

(57) ABSTRACT

Apparatus and methods for mitigating abrupt release of energy due to a short circuit or other fault external to battery modules in a battery pack. Each battery module includes a plurality of weakened fusible links, which may connect an associated cell to a virtual cell busbar or connect dedicated busbars. After the fault has been cleared and faulted battery modules have been bypassed, the battery pack is ready for reconnection to the electrical network to provide power for the load(s). The battery management includes detection and isolation of a fault followed by execution of an algorithm for reconnection of the battery pack to the power distribution system after burnout of the fusible links. In addition, the respective activation times for reconnecting operative (not faulty) modules in a faulty battery string versus reconnecting other operative battery strings in the battery pack are coordinated.

20 Claims, 18 Drawing Sheets

(51) Int. Cl.
*H01M 50/502* (2021.01)
*H01M 50/583* (2021.01)
*H02H 1/00* (2006.01)
*H02H 7/18* (2006.01)

(52) U.S. Cl.
CPC ........ *H01M 50/583* (2021.01); *H02H 1/0015* (2013.01); *H02H 7/18* (2013.01); *H02J 7/0013* (2013.01); *H02J 7/00304* (2020.01); *H02J 7/0047* (2013.01); *H02J 7/0063* (2013.01); *B64D 2221/00* (2013.01); *H01M 2200/103* (2013.01); *H02J 2310/44* (2020.01)

(58) Field of Classification Search
CPC ................ H02J 2310/44; G01R 15/04; H01M 50/502; H01M 50/583; H01M 2200/103; H02H 1/0015; H02H 7/18; B64D 2221/00
USPC .................................... 320/116, 109; 701/22
See application file for complete search history.

(56) References Cited

FOREIGN PATENT DOCUMENTS

| | | | | |
|---|---|---|---|---|
| EP | 3276736 A1 | * | 1/2018 | ........... G01R 31/382 |
| JP | 06223815 A | * | 8/1994 | |
| JP | H06223815 A | | 8/1994 | |

OTHER PUBLICATIONS

Augeard et al., "Contribution to the Study of Electric Arcs in Lithium-Ion Batteries", IEEE Transactions on Components, Packaging and Manufacturing Technology, vol. 6, No. 7, Jul. 2016.

Augeard et al., "Arc Analysis to the CID of Li-ion Battery Cells in High-Current Applications", 2014 IEEE 60th Holm Conference on Electrical Contacts, Oct. 12-15, 2014, New Orleans, Louisiana, USA.

Provisional Opinion and Partial Search Report issued on Nov. 23, 2022, in European Patent Application No. 22179428.2 (European counterpart of the instant U.S. patent application).

* cited by examiner

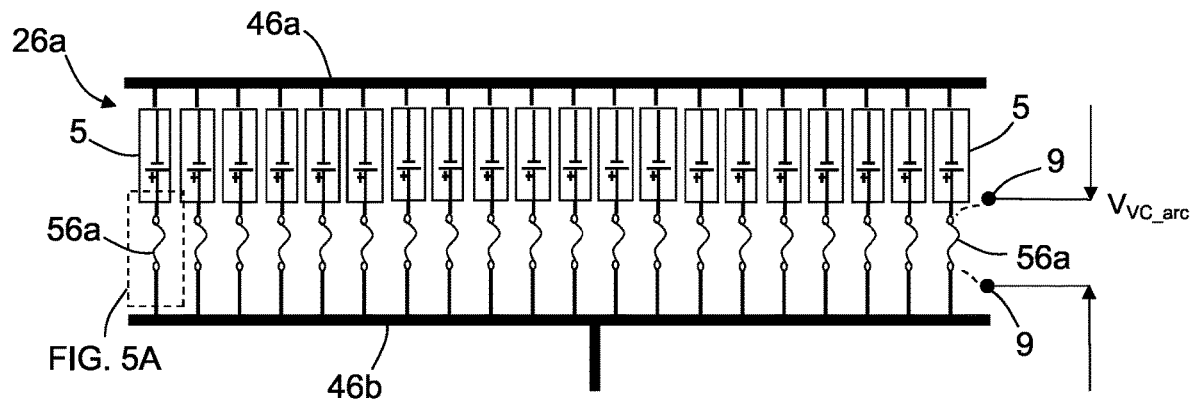
FIG. 5
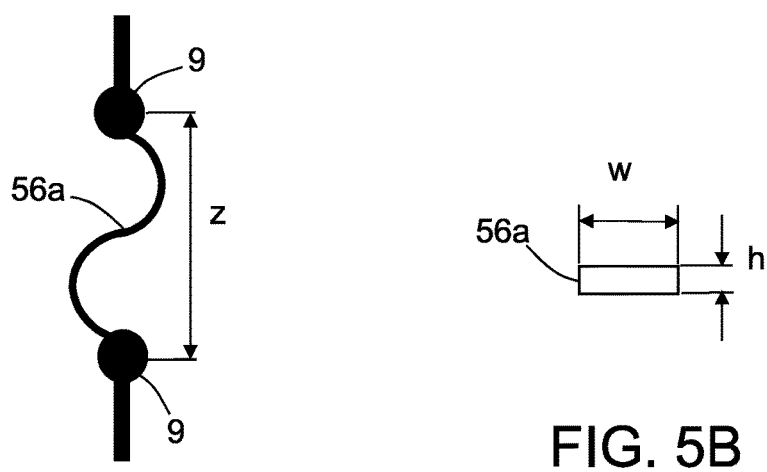
FIG. 5A
FIG. 5B

APPARATUS AND METHODS FOR ARC DETECTION, FAULT ISOLATION, AND BATTERY SYSTEM RECONFIGURATION

BACKGROUND

This disclosure generally relates to apparatus and methods for managing a modular battery system and, in particular, relates to apparatus and methods for managing a faulty battery pack that is supplying high-voltage direct-current (HVDC) power to a propulsor motor controller.

When alternating-current (AC) motors are used for propulsion of an aircraft, electrical energy supplied by a DC power source is converted to AC power. For instance, the DC power source may include a plurality of mutually parallel strings of series-connected battery modules. In one implementation, the batteries are connected to a HVDC bus, which in turn is connected to a motor controller that converts DC power to AC power for use by the AC motor. As used herein, the term "high voltage" in the context of direct current means any DC voltage higher than a more-electric aircraft DC voltage of 540 $V_{DC}$, or for simplicity, higher than 600 $V_{DC}$.

In some aircraft all-electric or hybrid electric propulsive schemes, is high-capacity high-voltage (e.g., 600/1000/2000 $V_{DC}$) battery packs are used to provide power to large electric motors. Electric propulsive schemes and overall systems require protection against short circuits. (As used herein, the term "short circuit" means an electrical circuit that allows a current to travel along an unintended path with no or very low electrical impedance.) A common type of short circuit occurs when the positive and negative terminals of a battery are connected by means of a low-resistance conductor.

Aircraft battery packs may have architectures with multiple strings arranged in parallel to ensure sufficient power flow into a load(s) at a fixed level of operation. Each battery string comprises series-connected battery modules. Each battery module in a string is a parallel/series arrangement of individual cells. For example, the battery module may include multiple rows of cells (each row of cells being referred to herein as a "virtual cell"), each row including multiple cells connected in parallel across a pair of anode and cathode current collectors (referred to hereinafter as "cell busbars"). The virtual cells are connected in series to form a battery module. The parallel cells within a battery module may be connected with respective fusible links which protect each individual cell against cell failure.

Each battery module includes basic protections to ensure safe standalone operation. In case of individual cell short circuit failure, the fusible link in series with a failed cell will see the current of all the parallel cells and open due to over-current. The failed cell will be isolated and the battery module will remain operational with reduced capability. There is no arcing due to the low voltage across a single fusible link. However, in case of a battery module external short circuit, the combined (e.g., all) fusible links of one virtual cell will open due to over-current and isolate the battery module. Thus, the battery module will be an open circuit and non-operational. In the absence of a solution, the battery string including the unhealthy battery module also becomes non-operational.

There is a need to manage to the battery modules of a battery pack following opening of virtual cells when fusible links blow open in response to an external short circuit across one or more battery modules. The fusible links act as a fuse if a short occurs between the positive and negative leads of a battery module due to a significant decrease in resistance across the battery module followed by very high short-circuit currents. In some cases, an electric arc may occur across the blown fusible links. An arc is a plasma column between two electrodes of opposite polarity, established when the dielectric strength of the atmosphere is exceeded. When the blocks of paralleled cells (virtual cells) are connected in series to produce a required voltage and an arc is burning across the blown fusible links, the voltage of the battery pack may be sufficient to sustain the arc and cause damage. The problem is that the fusible links (or functionally similar devices called current interrupting devices or positive thermal coefficient devices) act as a primary source to mitigate excessive current flow into a shorted cell, but also play a negative role if a short occurs external to a high-voltage battery module.

SUMMARY

The subject matter disclosed in some detail below is directed to apparatus and methods for mitigating abrupt release of energy in the case of a short circuit or other fault external to and across one or more battery modules in a battery pack. In accordance with various embodiments, each battery module includes a plurality of dedicated fusible links (hereinafter "weakened fusible links") which are marginally "weaker" than other fusible links present in the battery module (e.g., in each virtual cell). The weakened fusible links may connect an associated cell to a virtual cell busbar or may connect dedicated busbars which are not connected to battery cells. A methodology is disclosed herein for sizing the weakened fusible links during system design. The arc detection methods disclosed herein do not require either constant monitoring for current or a comparison of two or more measurements in order to detect a fault across the gap formed by blown fusible links.

After the fault has been cleared and faulted battery modules have been bypassed, the battery pack is ready for reconnection to the electrical network to provide power for the load(s). The battery management techniques proposed herein include detection and isolation of a fault followed by execution of an algorithm for reconnection of the battery pack to the HVDC power distribution system after burnout of the fusible links. In addition, a method is disclosed which is suitable for accurate coordination of the activation time for reconnecting operative (healthy) modules in a faulty battery string with respect to the activation time for reconnecting other operative battery strings in the battery pack.

As used herein, the term "weakened fusible link" means a small fuse that is configured (e.g., sized and shaped) to develop an arc across its length faster and has a lower current rating (faster opening time) than other "non-weakened" fusible links in the same battery module. This ensures that the weakened fusible links open (e.g., blow) before non-weakened fusible links open. As used herein, the term "battery module" means a battery that includes a multiplicity of battery cells wired in series, parallel, or a mixture thereof. As used herein, the term "battery string" means a plurality of battery modules wired in series.

The various embodiments of apparatus for implementing the above-described methods incorporate one of more of the following features: (a) dedicated fusible links which are marginally weaker; (b) weakened fusible links which are designed to ensure that an arc supported by the fusible links extinguishes by itself for any system voltage; (c) a dedicated device that detects arcing across the weakened fusible links and then reports the event to an electronic load control unit (ELCU); (d) an algorithm (inside the ELCU) that commands the battery modules to reconnect; (e) a method for reconnecting the modules in a single string feeding one or more loads; and (f) a method for reconnecting the modules in a string of a battery pack that has other strings connected in parallel to feed one or more loads.

Although various embodiments of apparatus and methods for mitigating abrupt release of energy in a battery pack due to a fault external to and across one or more battery modules will be described in some detail below, one or more of those embodiments may be characterized by one or more of the following aspects.

One aspect of the subject matter disclosed in detail below is a battery module comprising: a first bus comprising a first busbar and a second busbar; a first plurality of battery cells connected to one of the first and second busbars; a plurality of weakened fusible links connected to another of the first and second busbars and respectively connected to the first plurality of battery cells; a second bus comprising a third busbar and a fourth busbar; a second plurality of battery cells connected to one of the third and fourth busbars; and a plurality of non-weakened fusible links connected to another of the third and fourth busbars and respectively connected to the second plurality of battery cells. The weakened fusible links are configured to blow open prior to the non-weakened fusible links blowing open in case of a short circuit across an anode and a cathode of the battery module.

Another aspect of the subject matter disclosed in detail below is a battery system comprising: positive and negative battery busbars; a battery string comprising first and second half-strings which are connected in series across the positive and negative battery busbars, wherein the first half-string comprises a plurality of battery modules connected in series, each of the battery modules comprising an anode, a cathode, a plurality of virtual cells connected in series between the anode and cathode, the plurality of virtual cells comprising a first virtual cell comprising parallel battery cells connected to weakened fusible links and a second virtual cell comprising parallel battery cells connected to non-weakened fusible links, a bypass switch connected to the anode and cathode, and an arc detection apparatus positioned and configured to detect an arc in the first virtual cell; and an electronic load control unit connected to each arc detection apparatus and to each bypass switch and configured to close the bypass switch of any battery module in which the arc detection apparatus outputs a status signal indicating the presence of an arc in the first virtual cell of the battery module.

A further aspect of the subject matter disclosed in detail below is a battery system comprising: a pair of busbars; a battery pack comprising a plurality of battery strings connected in parallel across the positive and negative busbars; a plurality of string contactors disposed between and connected to one of the busbars and respective battery strings; a plurality of electronic control units connected to respective battery strings; and a battery pack management system which is communicatively coupled to the plurality of electronic control units. Each battery string comprises first and second half-strings which are connected in series across the positive and negative battery busbars, and a mid-point disconnect circuit disposed between and connected to the first and second half-strings. The first half-string comprises a first plurality of battery modules connected in series and the second half-string comprises a second plurality of battery modules connected in series. Each of the battery modules comprises an anode, a cathode, a plurality of virtual cells connected in series between the anode and cathode, the plurality of virtual cells comprising a first virtual cell comprising parallel battery cells connected to weakened fusible links and a second virtual cell comprising parallel battery cells connected to non-weakened fusible links, a bypass switch connected to the anode and cathode, and an arc detection apparatus positioned and configured to detect an arc in the first virtual cell. Each electronic load control unit is connected to each arc detection apparatus and to each bypass switch of a respective battery string and is configured to close the bypass switch of any battery module in which the arc detection apparatus outputs a status signal indicating the presence of an arc in the first virtual cell of the battery module.

Yet another aspect of the subject matter disclosed in detail below is a method for configuring a battery string which is electrically connected to a busbar when a string contactor is closed, the battery string comprising a pair of half-strings which are electrically connected in series when a mid-point disconnect circuit is closed, one of the half-strings being electrically connected to the busbar via the closed string contactor, and each of the half-strings comprising a respective plurality of battery modules connected in series. The method comprises: detecting an occurrence of an arc in a faulty battery module that is included in one of the pluralities of battery modules; and closing a bypass switch that connects an anode and a cathode of the faulty battery module in response to detection of the arc. In accordance with some embodiments, the method further comprises opening the string contactor and the mid-point disconnect circuit prior to closing the bypass switch.

A further aspect is a battery module comprising: a first bus comprising a first busbar and a second busbar; a first plurality of fusible links connected to the first and second busbars; a second bus comprising a third busbar and a fourth busbar; a plurality of battery cells connected to one of the third and fourth busbars; and a second plurality of fusible links connected to another of the third and fourth busbars and respectively connected to the plurality of battery cells, wherein the first plurality of fusible links are configured to blow open prior to the second plurality fusible links blowing open in case of a short circuit across an anode and a cathode of the battery module.

Other aspects of apparatus and methods for mitigating abrupt release of energy in a battery pack due to a fault external to and across one or more battery modules are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the diagrams are drawn to scale.

FIG. 5 is a diagram representing the single virtual cell having weakened fusible links depicted in FIG. 4.

FIG. 5A is a diagram representing a top view of a single weakened fusible link of the virtual cell depicted in FIG. 5.

FIG. 5B is a diagram representing a cross-sectional view of the weakened fusible link depicted in FIG. 5A.

Reference will hereinafter be made to the drawings in which similar elements in different drawings bear the same reference numerals.

DETAILED DESCRIPTION

Illustrative embodiments of apparatus and methods for mitigating abrupt release of energy in a battery pack due to a fault external to and across one or more battery modules are described in some detail below. However, not all features of an actual implementation are described in this specification. A person skilled in the art will appreciate that in the development of any such embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The airplane electric propulsion systems disclosed herein include an electric motor that drives rotation of a propeller, one or more motor controllers that are configured to convert direct current (DC) into alternating current (AC), and a DC power source (e.g., a battery system). The DC power source may include, for example, a DC-to-DC converter for increasing, or stepping-up, the voltage level of a low-voltage DC power source to form a high-voltage DC (HVDC) power source. As used herein, a DC-to-DC converter is an electrical or electromechanical device used to change the voltage level of the DC power source. The HVDC power may then be fed to one or more inverters of the motor controller to form a high-voltage AC power source.

With high power and voltage potentially exceeding 1000 $V_{dc}$, an electric propulsion system would benefit by incorporation of the capability to detect and isolate a fault across one battery module or across two or more series-connected battery modules in a half-string and then reconfigure and reconnect the battery pack to provide reduced DC power to the motor controller. Although the apparatus and methods proposed herein will be described with reference to an aerospace electric propulsion system, persons skilled in the art may appreciate that the concepts disclosed herein may also be applied to electric propulsion systems used to propel vehicles other than aircraft (e.g., automobiles, trains, and ships).

Figure 1:
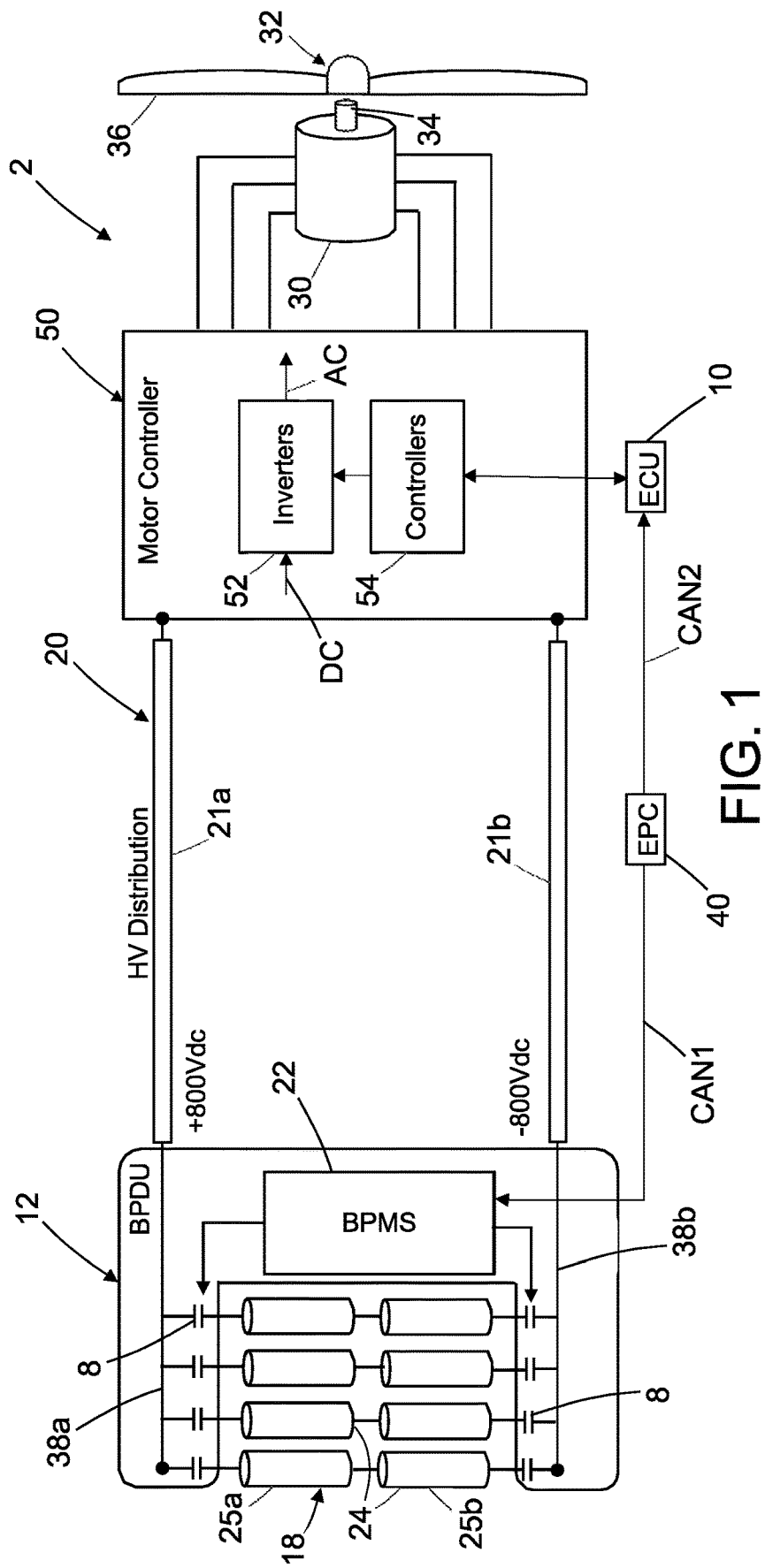
FIG. 1 is a diagram representing an aerospace electric propulsion system architecture with a single propulsor powered by a battery system comprising a plurality of battery strings connected in parallel in accordance with one embodiment.

FIG. 1 is a diagram representing an aerospace electric propulsion system architecture with a single propeller 32. The electric propulsion system 2 partly depicted in FIG. 1 includes a motor controller 50 which converts DC power to AC power, an AC motor 30 that receives AC power from the motor controller 50, and a propeller 32 driven to rotate by the AC motor 30. The propeller 32 includes a propeller shaft 34 which is mechanically coupled to the output shaft of the AC motor 30 and a plurality of propeller blades 36. The DC power source is a battery pack 18 which is connected to motor controller 50 via a HVDC power distribution system 20 that includes positive and negative HVDC power lines 21a and 21b.

The battery pack 18 is connected to the HVDC power distribution system 20 via a battery power distribution unit 12 (hereinafter "BPDU 12"). The BPDU 12 is essentially an enclosure that contains hardware needed for monitoring, commutating, and controlling the DC power output by the battery pack 18. The motor controller 50 receives that DC power via the HVDC power distribution system 20.

In accordance with some embodiments, the battery pack 18 includes a plurality of independent battery strings 24. Each battery string 24 comprises a pair of half-strings 25a and 25b consisting of respective sets of series-connected battery modules (not shown in FIG. 1, but see battery modules 4 in FIG. 2). The number of battery modules in each string is selected to produce a battery string 24 with the required usable voltage/potential. In the example depicted in FIG. 1, each battery string 24 includes a first half-string 25a of (e.g., four) series-connected battery modules indirectly connected (via a respective mid-point battery disconnect unit not shown in FIG. 1) to a second half-string 25b of (e.g., four) of series-connected battery modules.

The BPDU 12 includes positive and negative battery busbars 38a and 38b (hereinafter "battery busbars 38a and 38b"). The BPDU 12 further includes a first plurality of string contactors 8 that connect one end of each battery string 24 to battery busbar 38a and a second plurality of string contactors 8 that connect the other end of each battery string 24 to battery busbar 38b. (A contactor is an electrically controlled switch used for switching an electrical power circuit. Contactors are designed to be directly connected to high-current load devices.) The HVDC power distribution system 20 receives DC power from the battery pack 18 via (closed) string contactors 8 and supplies that DC power to the motor controller 50.

The BPDU 12 further includes a battery pack management system 22 (hereinafter "BPMS 22"). The operation of the battery pack 18 is managed by the BPMS 22. Multiple parallel battery strings may provide redundancy in case of pack internal failure. The BPMS 22 may be configured to ensure redundant protections, fail-safe operation, and selective shutdown of battery strings 24. The BPMS 22 may be further configured to provide battery overcharge protection or to forestall other events or combination of events that could lead to battery thermal runaway. More specifically, the BPMS 22 has the capability to change the switching states of string contactors 8.

The DC power generated by battery pack 18 is supplied (possibly with power loss) to the motor controller 50 via the HVDC power distribution system 20. In some implementations, the motor controller 50 has three channels for providing AC current to respective sets of stator windings in the AC motor 30. Each channel of the motor controller 50 comprises a respective inverter 52 having power switches and a respective inverter controller 54 which controls the states of the power switches. The inverters 52 are connected to windings (not shown in FIG. 1) of the AC motor 30. The operation of the inverters 52 is controlled by the inverter controllers 54, which send switch control signals to and receive switch state signals from the inverters 52 via switch signal lines. The inverters 52 convert DC power into multi-phase AC power for the AC motor 30.

As seen in FIG. 1, the electric propulsion system 2 further includes an engine control unit 10 (hereinafter "ECU 10"). The ECU 10 interfaces with the inverter controllers 54, which are communicatively coupled to receive control signals from ECU 10 and send feedback signals to ECU 10. The ECU 10 performs a role of supervision and coordination for all inverter controllers 54. The ECU 10 is further communicatively coupled to an electric propulsion controller 40 (hereinafter "EPC 40").

The EPC 40 controls the overall operation of the airplane electric propulsion system 2 depicted in FIG. 1. The EPC 40 receives pilot inputs from a thrust control lever and a pitch control lever (not shown in FIG. 1). The EPC 40 communicates with the BPMS 22 and ECU 10 via respective controller area networks (indicated by CAN1 and CAN2 in FIG. 1). The EPC 40 sends digital torque control signals to the ECU 10. The EPC 40 also sends analog control signals to a governor (not shown in FIG. 1) for controlling feathering of the propeller 32. The governor may be a constant-speed propeller governor configured to keep the propeller rpm constant by varying the propeller blade pitch. Hydraulic governors accomplish this by using a hydraulic valve to control the flow of engine oil through hydraulic mechanisms in the propeller 32.

Figure 2:
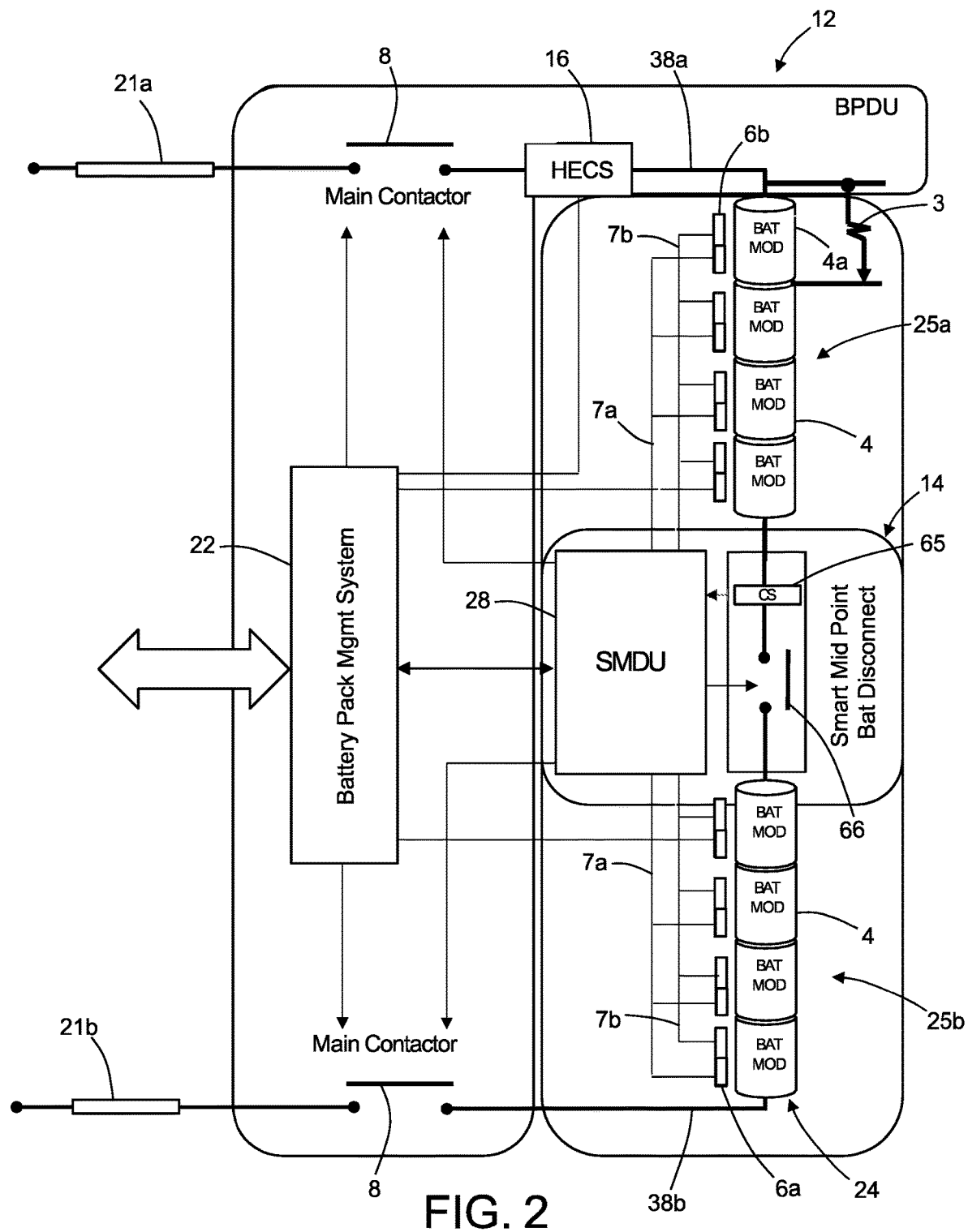
FIG. 2 is a diagram representing in some detail a portion of the system depicted in FIG. 1, including a battery power distribution system, one battery string (other battery strings are not shown), and a mid-point battery disconnect subsystem disposed between two half-strings in accordance with one embodiment. The battery string is shown in a state wherein one battery module has a short circuit across multiple virtual cells.

FIG. 2 is a diagram representing in some detail the configuration of a portion of the system depicted in FIG. 1 in accordance with one embodiment. The components depicted in FIG. 2 include the BPDU 12, one battery string 24 (other battery strings are not shown), a mid-point battery disconnect subsystem 14 disposed between half-strings 25a and 25b of battery string 24, and the BPMS 22. The battery string 24 is shown in a state wherein one battery module 4a has an external short circuit 3 across its anode and cathode.

Although the battery pack 18 includes multiple independent battery strings, only one battery string 24 comprising respective half-strings 25a and 25b is shown in FIG. 2. In the example embodiment depicted in FIG. 2, each half-string 25a and 25b consists of four battery modules 4 connected in series. The half-strings 25a and 25b are connected in series by means of a mid-point battery disconnect subsystem 14. Each battery string 24 supplies DC power to a pair of battery busbars 38a and 38b via respective (closed) string contactors 8. DC power from battery busbars 38a and 38b is distributed to HVDC loads by means of respective HVDC power lines 21a and 21b.

As seen in FIG. 2, each battery string 24 has a dedicated pair of string contactors 8 located on the plus and minus sides to provide galvanic isolation string by string. The battery strings 24 are connected together in the BPDU 12 via the battery busbars 38a and 38b when the string contactors 8 are closed. Additionally, a respective dedicated end-point current sensor 16 (e.g., a Hall effect current sensor) is disposed between the string contactor 8 connecting each half-string 25a to the positive (or negative) battery busbar 38a.

The BPMS 22 is configured (e.g., programmed) to control the different positive and negative string contactors 8 depending on the operating mode (charge, discharge, etc.) and system/pack protection mode (system short-circuit protection, unbalanced string current, etc.). Each pair of positive and negative string contactors 8 is under dual control by a respective mid-point battery disconnect subsystem 14 and the BPMS 22. The BPMS 22 is communicatively coupled to all mid-point battery disconnect subsystems 14 for coordination purposes. The BPMS 22 is in charge of communicating with the autopilot and others line-replaceable units of the electrical propulsion system.

Each battery string 24 further includes a first plurality of module monitoring units 6a and a second plurality of module monitoring units 6b, which monitor the states of cells inside each battery module 4. Each battery module 4 is monitored by two independent dissimilar module monitoring units 6a and 6b. Each module monitoring unit includes sensors for independently measuring each virtual cell voltage and each individual cell temperature. The module monitoring units 6a also includes balancing circuits. The balancing circuits perform a passive (or active) balancing function that is activated and controlled by the associated mid-point battery disconnect subsystem 14. Module monitoring unit 6a communicates sensor data representing virtual cell voltage and individual cell temperature to the associated mid-point battery disconnect subsystem 14 via a databus 7a. In the charge mode, the mid-point battery disconnect subsystem 14 sends commands to the balancing circuits to guarantee proper balancing from virtual cell to virtual cell. Module monitoring unit 6b communicates sensor data representing virtual cell voltage and individual cell temperature to the BPMS 22 via a databus 7b. Additionally, module monitoring unit 6b can provide an aggregated flag for cell voltage and cell temperature out of bounds.

The mid-point battery disconnect subsystem 14 includes a smart mid-point disconnect unit 28 (hereinafter "SMDU 28") and a mid-point disconnect contactor 66. (As used herein, the modifier "smart" means that action is initiated or a device is controlled by a computer or processor based on received sensor data indicating the current state of the battery system.) The SMDU 28 includes a processor configured to control the state of the mid-point disconnect contactor 66. The SMDU 28 is communicatively coupled to the BPMS 22. The mid-point battery disconnect subsystem 14 further includes a mid-point current sensor 65 which outputs an electrical signal to SMDU 28 representing the current flowing through mid-point battery disconnect subsystem 14 when the mid-point disconnect contactor 66 is closed. The SMDU 28 also receives electrical signals representing the individual cell temperatures and virtual cell voltages from the module monitoring units 6a via data bus 7a.

The BPMS 22 and SMDU 28 are configured to independently control the states of the string contactors 8. In accordance with one proposed implementation, the SMDU 28 is configured to perform a battery string protection function that opens mid-point disconnect contactor 66 in case of failure when indicated by the current flowing through mid-point current sensor 65.

The mid-point battery disconnect subsystem 14 (partly depicted in FIG. 2) may be configured to protect against a short across an entire battery string 24 (with additional protection being provided by string contactors 8 which protect a faulted string from fault currents flowing from parallel strings). In accordance with the example implementation depicted in FIG. 3, the mid-point battery disconnect subsystem 14 includes a mid-point disconnect circuit 15 instead of a mid-point disconnect contactor. The mid-point disconnect circuit 15 includes a metal-oxide-semiconductor field-effect transistor (MOSFET) 88 (or other suitable semiconductor switch) and a diode 90 connected in parallel. A solid-state device may be used for battery packs of large size in which nominal voltage and current can be higher than levels which a contactor can tolerate. The SMDU 28 shown in FIG. 2 is configured to perform a battery string protection function that opens MOSFET 88 in case of failure.

Figure 3:
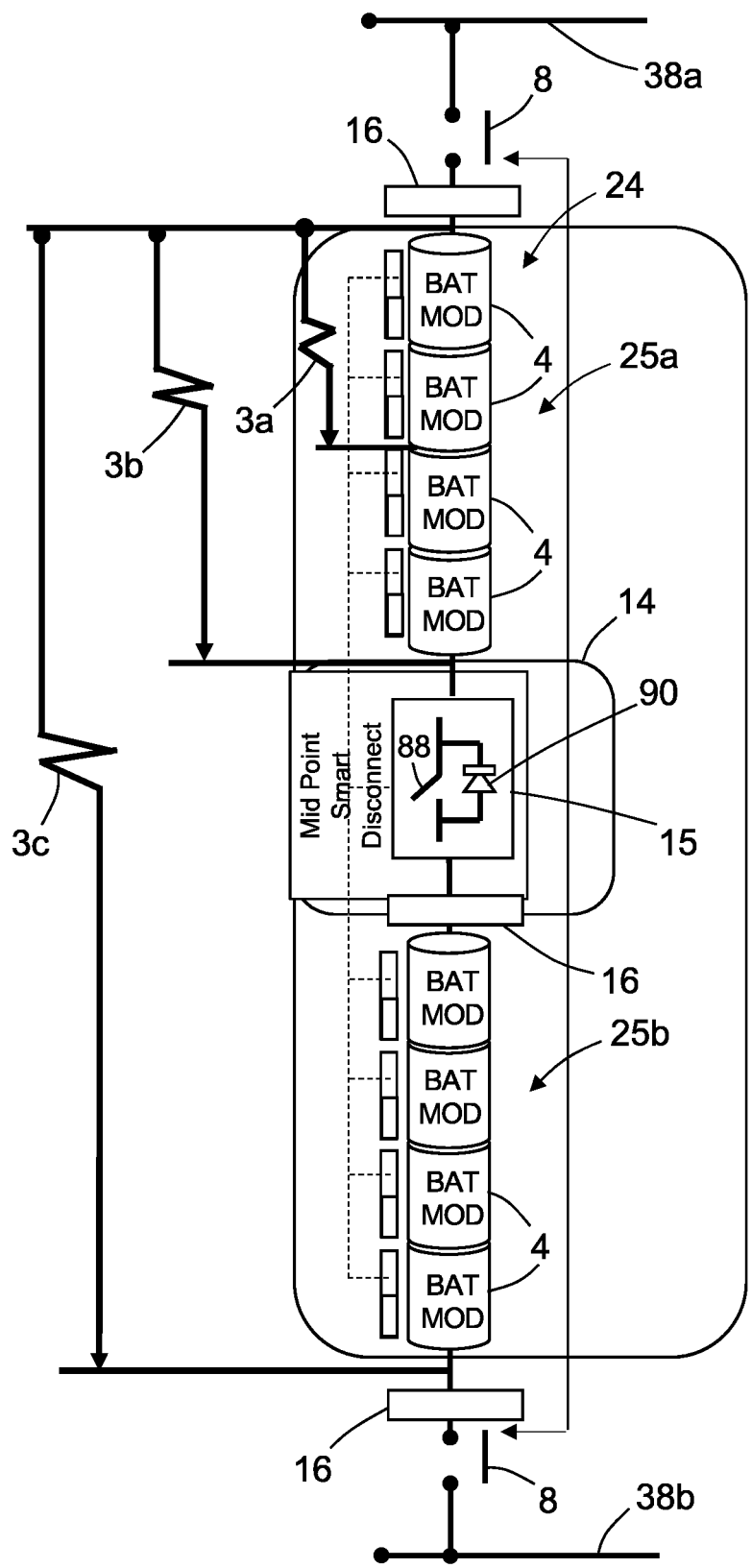
FIG. 3 is a diagram showing three types of faults which may respectively occur across two adjacent battery modules, across one-half-string, and across the entire string of an eight-module battery string in a battery system having mid-point battery disconnect subsystems disposed between the half-strings of each battery string.

However, mid-point battery disconnect subsystem 14 does not protect against any of the following: a short across one half-string, a short across a single battery module, and shorts across two or more series-connected battery modules in one half-string. For example, FIG. 3 shows three types of faults which may occur in a battery string 24 consisting of eight series-connected battery modules 4 separated into two half-strings 25a and 25b by a mid-point battery disconnect subsystem 14: (a) a fault 3a across two adjacent battery modules 4; (b) a fault 3b across one-half-string 25a (four battery modules 4); and (c) a fault 3c across the entire string 24. In these cases, mid-point battery disconnect subsystem 14 protects against fault 3c, but not faults 3a and 3b.

Accordingly, it would be an improvement to provide methods and apparatus for detecting and isolating faults across all or a portion of a half-string, such as faults 3a and 3b depicted in FIG. 3. In addition, it would be advantageous to provide methods and means for reconnection of any battery modules 4 in the string 24 which remain operational (ready for or in condition to resume generating DC power) after a fault across all or a portion of a half-string has been cleared. More specifically, the innovative technology proposed herein acts to: (a) clear the fault at the module's level (inside the module) by employment of an intentionally weakened fusible link with the capability to clear a fault faster than other protection means inside the module; (2) close a safety bypass switch inside the module, thereby enabling power flow at a reduced level via a bypassing path (this path has a very low resistance to mitigate any uncleared fault condition); and (3) if the fault is still persistent, then the bypass creates a parallel route for current.

The design of the battery module proposed herein ensures that the parallel path created by the short does not result in additional damage (practically, the bypass has a very low resistance such that the vast majority of current flows through the bypass, thereby significantly reducing heat generated at the location of the fault). In addition to making marginally reduced power available, the apparatus and methods proposed herein also reduce maintenance costs because the location of the damage is known and hardware located in proximity to the damage may be designed to be more easily removed, repaired, and reinstalled.

In addition, the ability to compensate for the loss of one or more battery modules 4 in a battery string 24 enables improved system availability. In accordance with the methodology proposed herein, an operational battery module in a battery string 24 may operate independent of non-operational battery modules of the same string. Also, after the fault has been cleared, components of the BPDU 12 are operated in a coordinated manner to reconnect the battery string 24 after clearing a fault across any single battery module or across two or more series-connected battery modules of a half-string. In accordance with a further attribute disclosed in some detail below, the presence of the fault may be tolerated if the fault has not been automatically cleared due to the ability to reroute most of the current through bypass switches.

Figure 4:
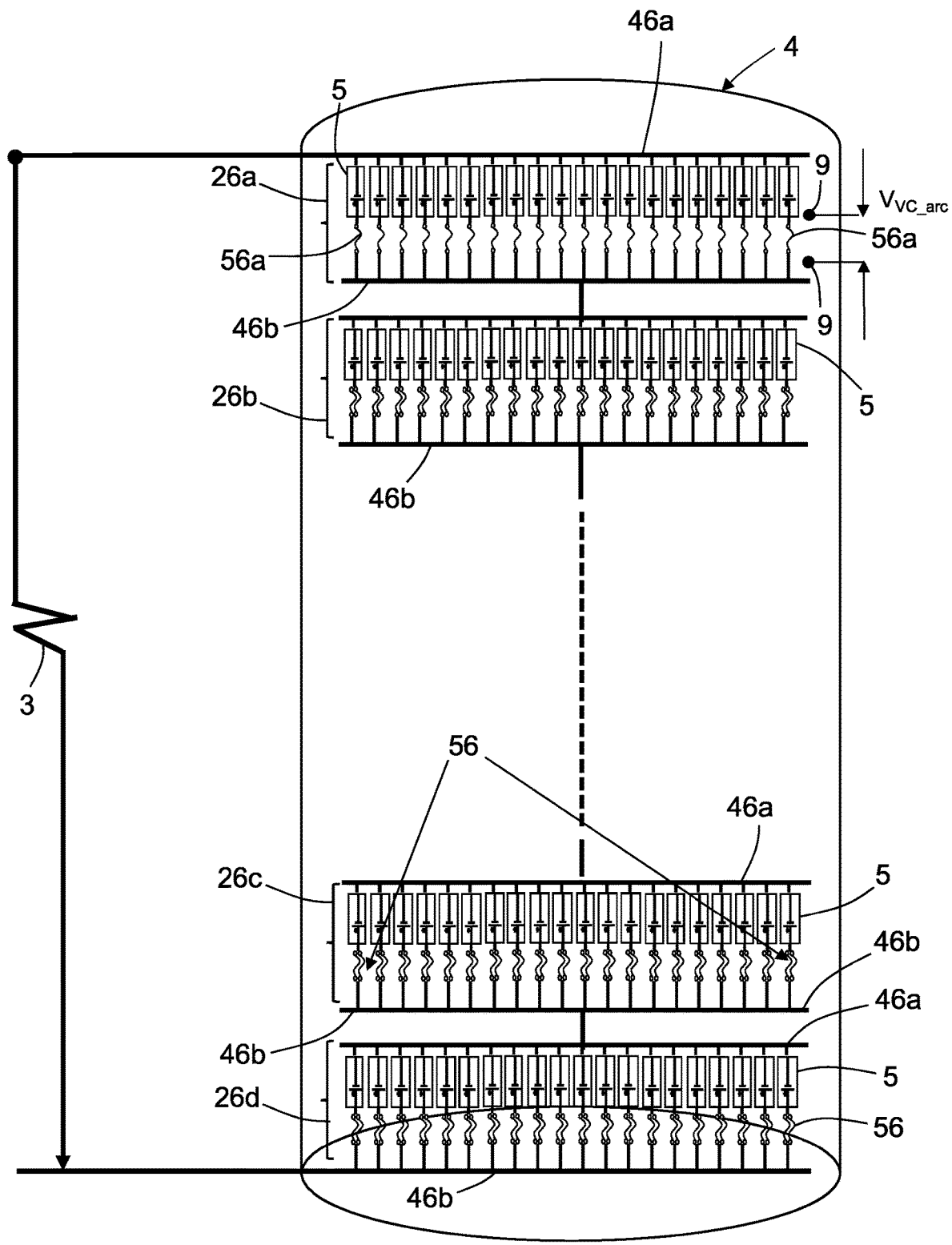
FIG. 4 is a diagram representing a single battery module comprising a single virtual cell having weakened fusible links and the remainder of the virtual cells having fusible links which are not weakened in accordance with one embodiment.

FIG. 4 is a diagram representing a single battery module 4 in accordance with one proposed implementation. Each battery module 4 is a parallel/series arrangement of individual cells 5. In the example depicted in FIG. 4, the battery module 4 includes four rows of cells 5, each row including twenty cells connected in parallel across a respective pair of cell busbars 46a and 46b. Each parallel cell arrangement is considered to be a virtual cell (or brick). The four virtual cells 26a-26d are connected in series. The cell arrangement for each of virtual cells 26b-26d is implemented using a respective non-weakened fusible link 56 in series with each individual cell 5 to protect against cell failure. In contrast, the cell arrangement for virtual cell 26a is implemented using respective weakened fusible links 56a connected in parallel to protect against cell failure.

The battery module 4 depicted in FIG. 4 includes basic protections to ensure safe standalone operation. In case of individual cell short circuit failure, the non-weakened fusible link 56 in series with the failed cell will receive the current of all the parallel cells and open due to over-current. The failed cell will be isolated and the battery module 4 will remain operational with reduced capability. There is no arcing due to the low voltage across a single non-weakened fusible link 56 (below the level of voltage of an individual cell, e.g., <5 $V_{DC}$).

In case of a battery module external short circuit (e.g., fault 3 in FIG. 4) across the anode (cell busbar 46a of virtual cell 26a) and cathode (cell busbar 46b of virtual cell 26d) of the battery module 4, the combined weakened fusible links 56a of virtual cell 26a are designed to open due to the over-current and isolate the battery module 4. Thus, the battery module 4 will be an open circuit and non-operational. However, to ensure that the degree of weakening (the current rating or opening time) of the weakened fusible links 56a is appropriate for a particular application, the fusible links must be sized properly. A methodology for sizing weakened fusible link in accordance with one proposed implementation will now be described.

The design parameters for one example of an individual battery module include the following:

$V_{VC}$=2.5 V to 4.2 V (nominal) is the voltage of a virtual cell (also the voltage across a single cell);

N is the number of parallel cells in one virtual cell;

M is the number of virtual cells per module;

L is the number of modules in a string;

$V_M$=M×$V_{VC}$ is the stack voltage across a single module;

$V_{sys}$=L×$V_M$=L×M×$V_{VC}$ is the stack voltage across the string, i.e., the system voltage; and $V_{VC\_arc}$=20 V to 100 V is practically the voltage across an arc across a virtual cell, i.e., across a fusible link during its burning, depending on the length of the arc, i.e., on the length of the fusible link (the voltage across the fusible link is normally below 0.1 V), and depending on the number of virtual cells per module.

The weakened fusible links have the following attributes which differ from the non-weakened fusible links: (a) a smaller cross section (higher resistance, shorter burning time); (b) a monitored voltage across the weakened fusible links; (c) the time-to-open $t_{blow}$ is shorter than the time-to-open $t_{blow\_NVC}$ of non-weakened fusible links in a normal virtual cell (NVC) ($t_{blow}$<½$t_{blow\_NVC}$ is an acceptable minimum); and (d) arc fault detection can be implemented optically (by photodiodes) or using digital or analog monitoring of voltage $V_{VC}$.

Fusible links are the primary means of protection against excessive current in the case of an internal-to-cell short circuit. Fusible inks blow open in the same way as a conventional fuse; to wit, fusible links are subject to the $I^2t$ law of the thermal fuse operation. Therefore, if a cell experiences an internal short between anode and cathode, its neighboring cells connected in parallel supply short-circuit current to the faulted cell. If a cell is unprotected, this results in the buildup and abrupt release of excessive energy inside the faulted cell. The fusible links are designed to blow open when the short-circuit current exceeds thresholds defined by the $I^2t$ curves.

Normally, the process of fusible link burning is accompanied by the formation of an electrically conducting arc. The arc's temperature and duration are defined by the current flowing through the arc and the activation time of the protection equipment. When the battery cells are assembled in a stack, especially with a greater number of series-connected cells, the residual voltage during a fault can be sufficient to sustain the arc for a long enough time to cause significant damage if protection is activated too late. The goal of the innovative technology proposed herein is to decrease the arcing time across the fusible link to an acceptable minimum to prevent catastrophic damage to the battery and other structures when one or more modules or an entire half-string are externally shorted.

When a short occurs across the outside of a battery module (e.g., arc 3 across the anode and cathode of the battery module), the short-circuit current that produces arcing is limited, but not decreased to zero, by the impedance of the arc across the fusible links. In other words, the closure of the circuit is supported by two arcs: the arc at the location of the fault and the arc across the fusible links. Therefore, abrupt release of thermal energy continues at the location of the fault, which may result in unacceptable damage. In certain cases, the residual voltage across the arc can be as low as 20 V.

FIG. 5 is a diagram representing the virtual cell 26a having weakened fusible links 56a as depicted in FIG. 4. The voltage across the cell busbars 46a and 46b (also known as "anode and cathode current collectors") is equal to the virtual cell voltage $V_{VC}$. The voltage across the electrodes or termini 9 (which are also shown isolated and enlarged) of each weakened fusible link 56a is indicated by $V_{VC\_arc}$ in FIG. 5.

FIG. 5A is a diagram representing a top view of a single weakened fusible link 56a of the virtual cell 26a depicted in FIG. 5. FIG. 5A shows the length z of the link. FIG. 5B is a diagram representing a cross-sectional view of the weakened fusible link 56a depicted in FIG. 5A. FIG. 5B shows the height h and width w of the weakened fusible link 56a. Length Z between termini 9 is an effective length of the conductive material, and the weakened fusible link can have a random shape (e.g. s-shape as it shown on FIG. 5A) for a practical purpose to save space.

The resistance of a single weakened fusible link 56a may be calculated using the following equation:

$$R = \rho \frac{z}{w \times h} \quad (1)$$

where p is the resistivity of the conducting material (e.g., copper); z is the length (shown in FIG. 5A) of the weakened fusible link 56a; w is the width (shown in FIG. 5B) of the weakened fusible link 56a; and h is the height (shown in FIG. 5B) of the weakened fusible link 56a. The fuse length z is determined by a selection process that is based on the desired voltage drop across the arc.

The cross-sectional area A (w×h) of a fusible link is defined by a law that establishes burning time of a link as a function of current, e.g., the Onderdonk equation (I=0.188× A/t^0.5 for copper) to bring the time-to-open t of the fusible link to an acceptable minimum. Since the shortened opening time is the result of decreased cross-sectional area, this also leads to increasing the resistance of the weakened fusible link. For example, to reduce arcing time to 50%, the cross-sectional area should be reduced by 25% and the resistance would be increased by the same 25% according to Eq. (1).

Figure 6:
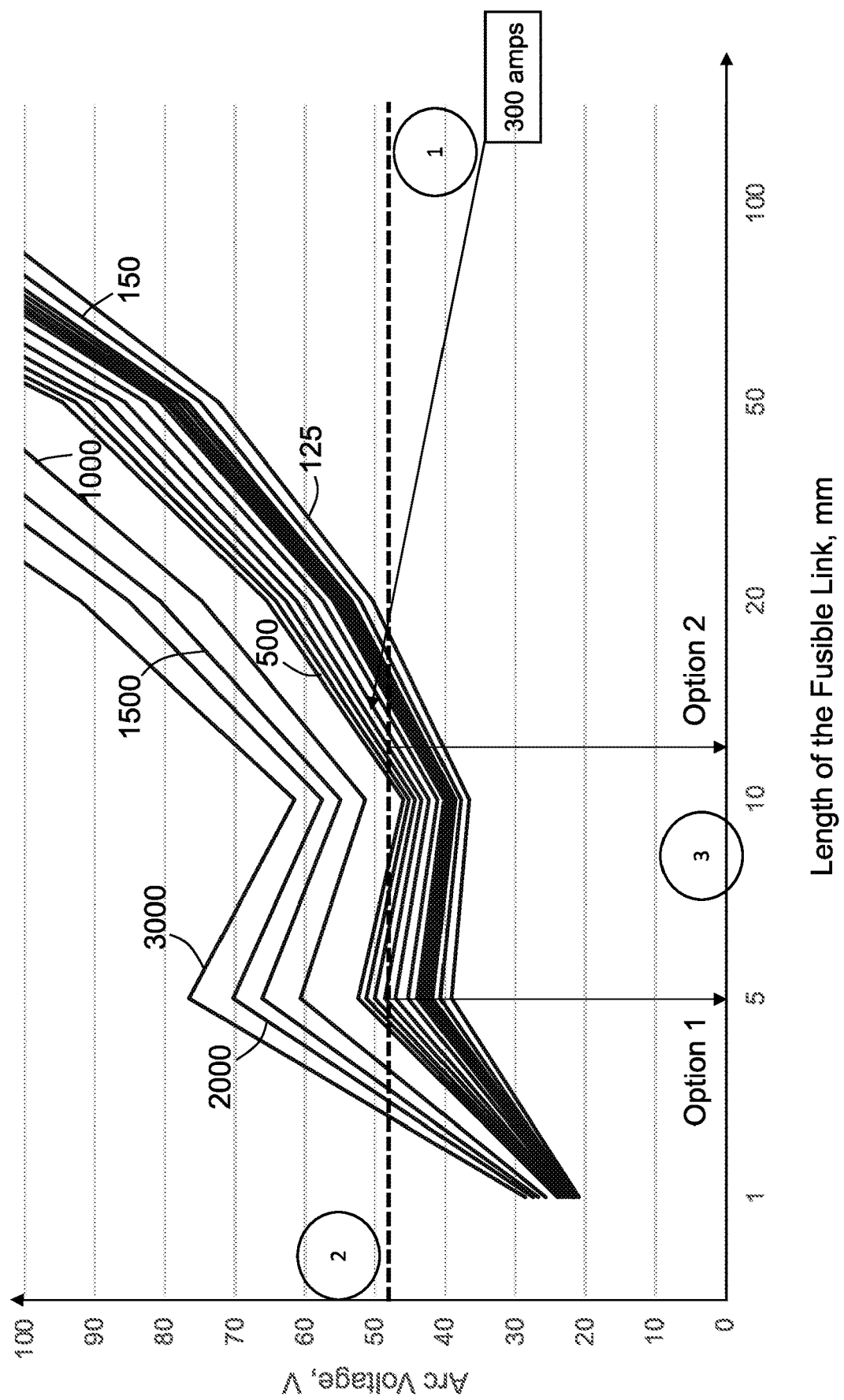
FIG. 6 is a graph showing estimated arc voltage (in volts) across a fusible link versus length (in mm) of the fusible link for various short-circuit currents (in amperes) in accordance with a DC-arc model.
Figure 7:
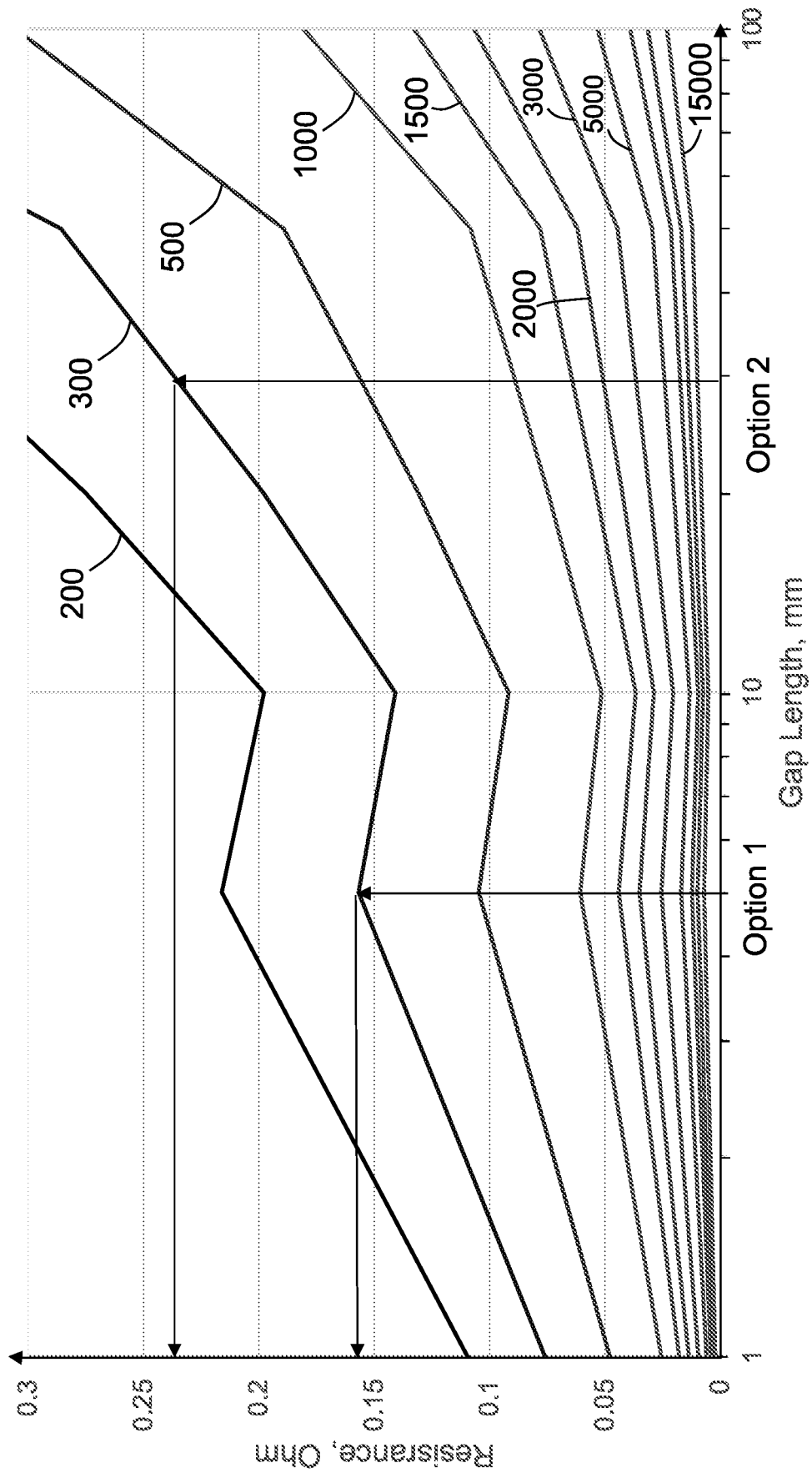
FIG. 7 is a graph showing arc resistance (in ohms) versus length (in mm) of the gap formed by a blown fusible link for various short-circuit currents (in amperes) in accordance with a DC-arc-resistance model.

To calculate the optimal length of the weakened fusible links, a computer simulation was conducted using DC-arc and DC-arc resistance models. FIG. 6 is a graph showing estimated arc voltage (in V) across a blown fusible link versus length (in mm) of the fusible link (which "length" becomes the "electrode gap" when the fusible link is blown) for various short-circuit currents (varying from 125 to 3,000 amperes) in accordance with a DC-arc model. FIG. 7 is a graph showing arc resistance (in ohms) versus electrode gap (in mm) for various short-circuit currents (varying from 200 to 15,000 amperes) in accordance with a DC-arc-resistance model.

The length of the weakened fusible link may be selected to achieve a desired resistance using the graphs in FIGS. 6 and 7 in a process comprising the following steps:

In the first step (indicated by the encircled numeral "1" in FIG. 6), the minimum and maximum short-circuit currents available from one of the virtual cells are determined by selecting the applicable curve from a group of curves on the graph of arc voltage versus fusible link length (FIG. 6), each curve having been derived for a respective different magnitude of the short-circuit current. In this example, the curve selected corresponded to a short-circuit current equal to 300 amperes). The minimum and maximum short-circuit currents are defined by the impedance of the circuit in different zones where a potential fault may occur and by the temperature of the cells.

In the second step (indicated by the encircled numeral "2" in FIG. 6), the maximum residual voltage (indicated by the horizontal dashed line in FIG. 6) during a fault across a half-string or across a single module is determined, which may be a function of the short-circuit current.

In the third step (indicated by the encircled numeral "3" in FIG. 6), the lengths of the fusible link at the intersection(s) (on the graph) for minimum and maximum short-circuit currents are determined. (FIGS. 6 and 7 are for demonstration purposes and do not represent actual or typical values of a length of fusible links, arc voltages or resistances, and short circuit currents).

Fourth, the resistance of the fusible link during arcing ($R_{FL\_arc}$) is determined in the manner described below with reference to FIG. 8.

Both dependencies calculated using the above-described method are nonlinear, i.e., the curves decrease slightly for the link lengths/gaps between approximately 5 mm to 10 mm. In this region, when the battery residual voltage during a short event (which shall be below arc voltage in order not to sustain the arc) is being selected, then the corresponding ordinate intersects the short-circuit current (300 A, for example) trace twice.

Figure 8:
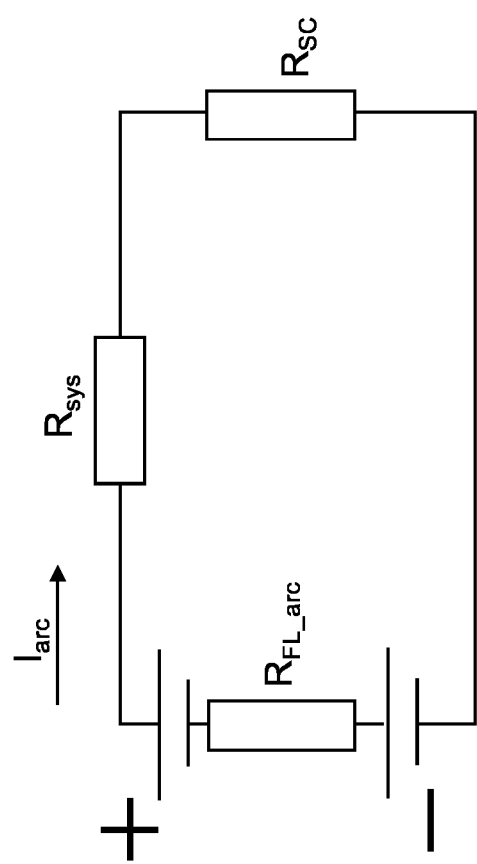
FIG. 8 is a diagram representing the resistances in a system (comprising a plurality of series-connected virtual cells, wires and cable) in which a short circuit has occurred at one location and an arc has occurred across the fusible links of one virtual cell.

FIG. 8 is a diagram representing the resistances in a system (comprising a plurality of series-connected virtual cells, wires, and cable) in which a short circuit has occurred at one location and an arc has occurred across the fusible links of one virtual cell. $R_{sys}$ is the resistance of the system (wires, fusible links, cables, etc.) (fixed). $R_{SC}$ is the resistance at the location of the fault (can be a bolted fault or another arc) (fixed/dynamic) $R_{FL\_arc}$ is the resistance of the arc across the fusible link (a function of the length of the fusible link and the short-circuit current) (dynamic) Thus, the arc voltage across the fusible link may be calculated using the following equation:

$$V_{FL\_arc} = \frac{V_{res\_bat} R_{FL\_arc}(t)}{R_{sys} + R_{SC}(t) + R_{FL\_arc}(t)} = A \times I_a^b$$

where $V_{res\_bat}$ is the residual voltage across the battery during a fault, given by the equation:

$$V_{res\_bat} = M \times L \times V_{res\_cell}$$

where $V_{res\_cell}$ is the residual voltage across a single cell assembled into a module during a fault.

The arc self-extinguishes if:

$$V_{FL\_arc} > V_{res\_bat} V_{sys} - V_{SC} \tag{2}$$

or:

$$\frac{M \times L}{N} R_{res\_cell} < R_{sys} + R_{SC}(t) + R_{FL\_arc}(t)$$

where $R_{res\_cell}$ is the residual resistance of a cell during a fault; M is the number of virtual cells in one module; L is the number of modules in series (affected by the short); and N is the number of parallel cells in a virtual cell.

Then the minimum length of the fusible link is selected using the graph of arc voltage versus fusible link length such that the resistance $R_{FL\_arc}$ satisfies Eq. (2). In the alternative, the following assumptions may be made:

Assumption 1: If the resistance at the location of the short circuit is unknown, the term $R_{SC}$ can be omitted with the assumption that the resistances of the arc across the fusible link and the system are sufficiently larger than the resistance of a cell during a short-circuit fault. Also, resistance of the bolted fault (no arcing) is assumed to be negligible compared to the arc and system resistances.

In both cases, Eq. (2) can be modified as follows:

$$\frac{M \times L}{N} R_{res\_cell} < R_{sys} + R_{FL\_arc}(t) \tag{3}$$

Assumption 2: If, nevertheless, resistance of a cell during the fault is high relative to the system and the arc across the fusible link, then an assumption may be made about the value of the resistance at the location of the fault. Practically, this scenario is realizable when an arc is formed at the location of the fault. One may then assume that the sought resistance is not smaller than the resistance of the arc across the fusible link, i.e., is equal to or greater than $R_{FL\_arc}$ and Eq. (2) can be modified further as follows:

$$\frac{M \times L}{N} R_{res\_cell} < R_{sys} + C \times R_{FL\_arc}(t) \tag{4}$$

where C is a constant greater than or equal to 2.

The arc currents for the three cases (without assumptions and without one of the assumptions) may be calculated using the following equations:

$$I_{arc} = \frac{V_{res\_bat}}{R_{sys} + R_{SC}(t) + R_{FL\_arc}(t)} \quad (5a)$$

$$I_{arc} = \frac{V_{res\_bat}}{R_{sys} + R_{FL\_arc}(t)} \quad (5b)$$

$$I_{arc} = \frac{V_{res\_bat}}{R_{sys} + C \times R_{FL\_arc}(t)} \quad (5c)$$

where constant C is equal to or greater than 2

The resistance $R_{sys}$ is a sum of the resistances of individual components which include, but are not limited to: output busbars at the interface with the rest of the electrical system, interconnecting modules cables, contactors, fuses, lugs, etc. Internal to the module, there are current-collecting plates and interconnects between the virtual cells. In addition, the fusible links under normal operations have finite resistance, typically close to several milliohms. Since the series-connected cells and their fusible links represent a source, its equivalent resistance and the resistance of the fusible link—all connected in series—are added to determine their contribution to the total $R_{sys}$.

The weakened fusible link has a smaller cross-sectional area as compared to the cross-sectional area of the non-weakened fusible links in other cells and therefore its resistance is higher by the value of the ratio of the cross-sectional area of the non-weakened (normal) fusible link to the cross-sectional area of the weakened fusible link per Eq. (1). While in the case of one large module, representing a battery with a number of series-connected cells, only one weakened link would not contribute significantly to the overall $R_{sys}$, the case of having multiple series-connected modules with a weakened (higher resistivity) link in each module may require the actual resistance of the weakened link calculated by Eq. (1) to be included in the calculation of resistance $R_{sys}$.

Figure 9:
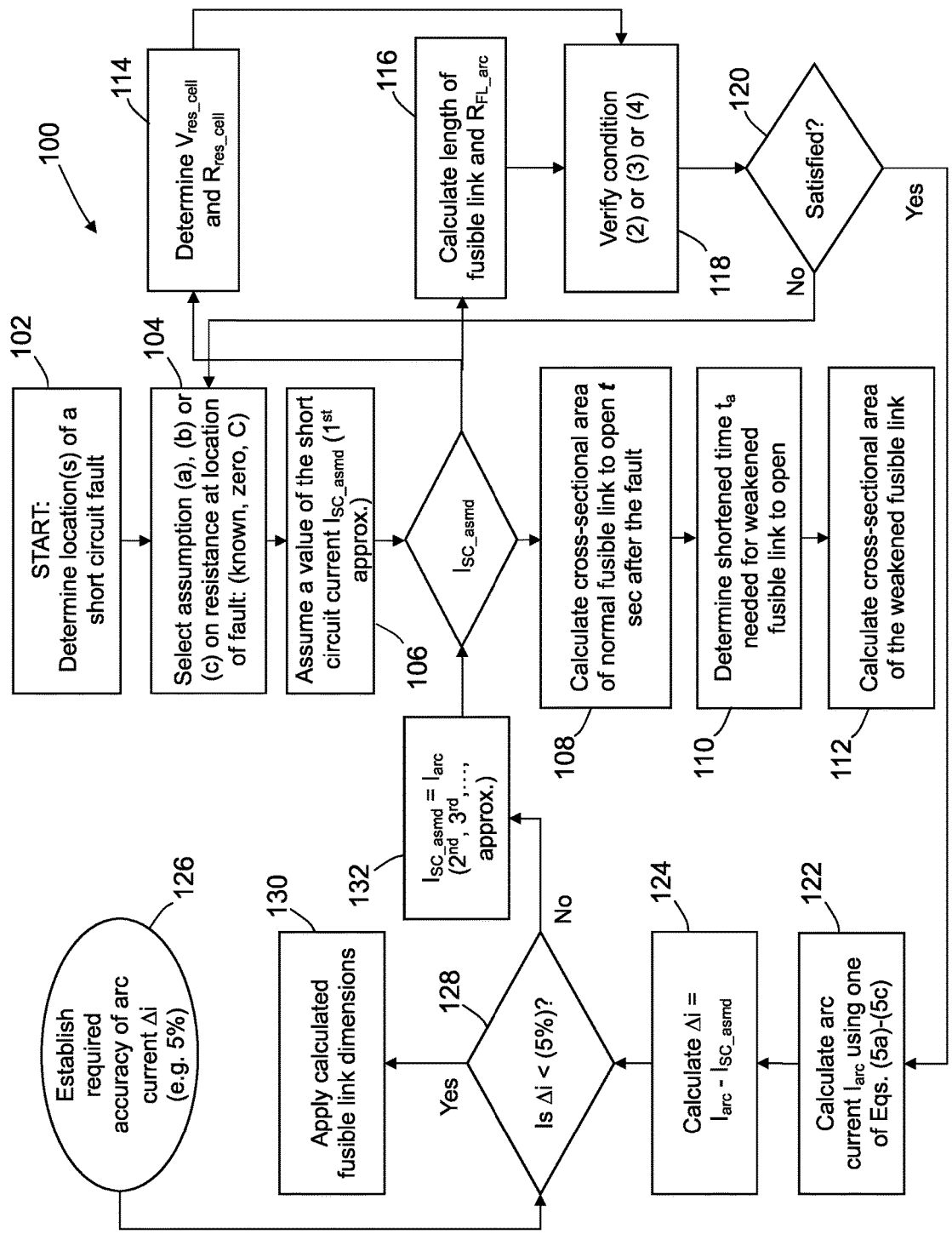
FIG. 9 is a flowchart identifying steps of an algorithm for selecting the length of the weakened fusible links depicted in FIG. 5 in accordance with one is proposed implementation.

FIG. 9 is a flowchart identifying steps of an algorithm 100 for selecting the length of the weakened fusible links depicted in FIG. 5 in accordance with one proposed implementation. First, the location of a modeled short circuit fault is determined (step 102). Then any one of three assumptions regarding the resistance at the location of the fault is selected (step 104). The optional assumptions (as previously described) are: (a) the resistance at the fault location is known; (b) the resistance at the fault location equals zero; or (c) the resistance at the fault location is not less than the resistance of the arc across the blown fusible link. Next, a value is assumed (or calculated using short-circuit analysis methods, hereinafter indicated by the subscript "asmd") for the short-circuit current $I_{SC\_asmd}$ for a first approximation (step 106).

The $I_{SC\_asmd}$ value and the Onderdonk equation are then used to calculate the cross-sectional area of a normal (not weakened) fusible link to open t second after initiation of the fault (step 108). Next, a shortened time $t_a$ for a weakened fusible link to open is determined (step 110). Then the cross-sectional area of the weakened fusible link is calculated (step 112), again using the Onderdonk equation.

The $I_{SC\_asmd}$ value is also used to determine the residual cell voltage $V_{res\_cell}$ and the residual cell resistance $R_{res\_cell}$ (step 114) and to calculate the length of the fusible link and the arc resistance $R_{FL\_arc}$ across the fusible link (step 116), using the analytical means or graphs provided as examples in FIGS. 6 and 7. Then an attempt is made to verify the selected assumption (step 118) and a determination is made whether the selected assumption has been verified or not (step 120). On the one hand, if the selected assumption is not verified, then the method 100 returns to step 104 and a different assumption is adopted.

On the other hand, if the selected assumption is verified, then the arc current $I_{arc}$ flowing through the system is calculated using the one of Eqs. (5a)-(5c) which corresponds to the selected assumption (step 122). Next, the current difference $\Delta i = I_{arc} - I_{SC\_asmd}$ is calculated (step 124). A required accuracy (e.g., 5%) for the current difference $\Delta i$ was previously established in step 126. The calculated current difference $\Delta i$ is compared to the required accuracy. For example, a determination is made whether the calculated current difference $\Delta i$ is less than 5% or not (step 128).

On the one hand, if a determination is made in step 128 that the calculated current difference $\Delta i$ is less than 5%, then the current calculations for the length and cross-sectional area of the fusible link are applied in the system design and method 100 is terminated (step 130). On the other hand, if a determination is made in step 128 that the calculated current difference $\Delta i$ is not less than 5%, then the current calculations are not accepted, then the next approximation for the assumed short-circuit current $I_{SC\_asmd}$ is adopted (step 132). Then steps 108, 114, and 116 are repeated and the process flows as previously described.

In accordance with a further aspect of the technology disclosed herein, active protection is provided for one or more battery modules by employing a current bypass scheme. This is accomplished by installing a bypass switch inside the module, thereby enabling power to flow at a reduced level via a bypassing path (this path has a very low resistance to mitigate any un-cleared fault condition). If the fault is still persistent, then the bypass creates a parallel route for current.

Figure 10:
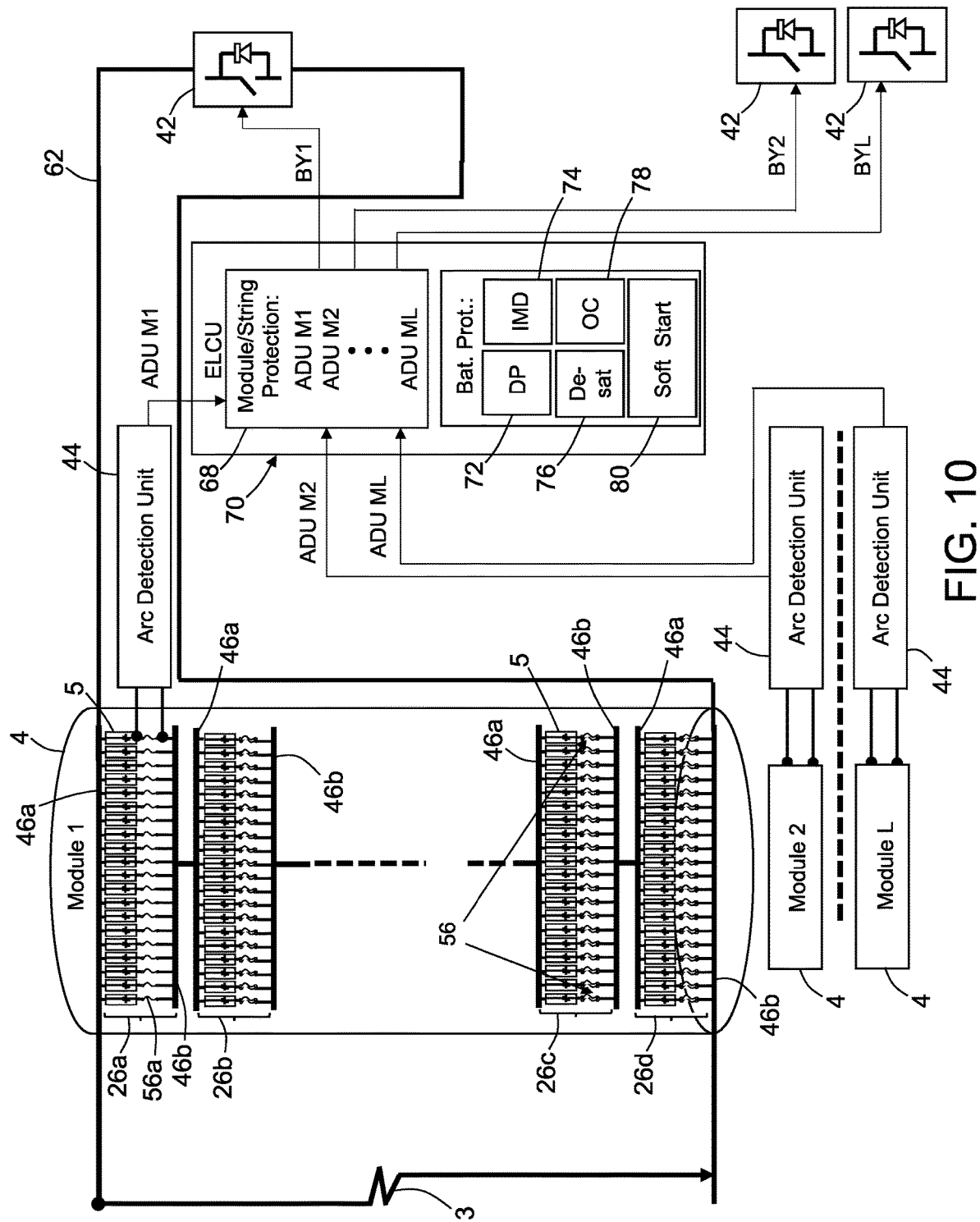
FIG. 10 is a diagram representing a string of battery modules and apparatus for detecting an arc across weakened fusible links in a virtual cell of one or more battery modules and then bypassing those battery modules in accordance with one embodiment.

FIG. 10 is a diagram representing a string of L battery modules and apparatus for detecting an arc across weakened fusible links 56a in a virtual cell 26a of one or more battery modules 4 and then bypassing those battery modules in accordance with one embodiment. In FIG. 10, Module #1 is shown in some detail; Module #2 is represented by a block; Module #3 through Module #(L-1) are not shown; and Module #L is represented by a block.

In accordance with one proposed implementation, assume that each battery module 4 has one virtual cell 56a with weakened fusible links 56a; the other virtual cells 26b-26d of the same battery module 4 each having non-weakened fusible links 56. Each battery module 4 is designed so that the weakened fusible links 56a of virtual cell 26a clear a fault across the battery module 4 faster than the other non-weakened fusible links 56. As previously explained, an arc may be initiated and sustained across the weakened fusible links 56a after they have been blown open.

As seen in FIG. 10, each virtual cell 26a with weakened fusible links 56a is monitored by a respective arc detection unit 44. Each arc detection unit 44 (hereinafter "ADU 44") is configured to detect the presence of an arc across the electrodes 9 of the blown fusible link and output a status signal (e.g., report a fault) to an electronic load control unit 70 (hereinafter "ELCU 70") via a respective signal line. For the purpose of illustration, the status signals from the ADUs 44 are respectively named ADU M1 through ADU ML, where M1 denotes Module #1 etc. In response to any status signal from an ADU 44 indicating the presence of an arc inside a battery module 4, the ELCU 70 will engage a bypass switch 42 to bypass the entire module to let that battery string's current flow. Other modules, if affected, also report arcs across their fusible links to the ELCU 70. The ELCU 70 commands each affected battery module 4 to bypass itself (by closing the associated bypass switch 42).

The ELCU 70 seen in FIG. 10 is part of the SDMU 28 seen in FIG. 2. The ELCU 70 is a processing unit (e.g., a microprocessor) with the overarching control function. It receives information from various lower-level controllers, including: differential protection module 72, insulation monitoring device 74, desaturation protection module 76, over-current protection module 78, and soft start control module 80. Based on the information received from the lower-level controllers, the ELCU 70 implements coordination with other elements of the electric system, including mid-point disconnect contactor 66 and string contactors 8 (see FIG. 2).

The ELCU 70 further includes a module/string protection module 68 which receives and stores the status signals ADU M1 through ADU ML. For example, a status signal "0" indicates that an arc has not been detected by the particular ADU 44; a status signal "1" indicates that an arc has been detected by the particular ADU 44. The ELCU 70 is further configured to engage a respective bypass switch 42 to bypass an entire battery module 4 in order to let the string's current flow from one HVDC busbar to the other. More specifically, the ELCU 70 sends controls signals via bypass links BY1 through BYL to respective bypass switches 42 to control the state of bypass switches 42. For example, a control signal "0" indicates that the bypass switch 42 should be opened; a control signal "1" indicates that the bypass switch 42 should be closed.

In the example depicted in FIG. 10, in response to a status signal indicating that the ADU 44 associated with Module #1 has detected an arc across the blown weakened fusible links, the ELCU 70 sends a control signal that commands the bypass switch 42 associated with Module #1 to close, thereby establishing a bypassing path 62 for the flow of current from cell busbar 46a of virtual cell 26a (effectively the anode of the battery module 4) to cell busbar 46b of virtual cell 26d (effectively the cathode of the battery module 4). Thus, the current in bypassing path 62 flows in parallel with any short-circuit current. In order to ensure efficient and safe bypass of a location of a fault inside a module and a weakened fusible link while the latter is being opened and potentially sustaining an arc, the resistance of the bypass circuit 62 is selected to be significantly lower than the combined resistances of a fault and an arc. Practically, this resistance shall be on the order of not greater than several milliohms. The ELCU 70 is configured to manage all of the bypass switches 42 for all of the battery modules 4 in one battery string in a similar manner FIG. 10 also requires the following clarifications. In accordance with proposed implementations described below with reference to FIGS. 12 and 13, the battery modules 4 include internal arc-detecting sensors (e.g., photodetector 58 in FIG. 12 and voltage-dividing resistors 60a and 60b with current limiting capabilities in FIG. 13) which are not shown in FIG. 10. In addition, the bypass switches 42—although depicted in FIG. 10 as being external to the battery module 4—are located inside the housing of the battery module 4.

Figure 11:
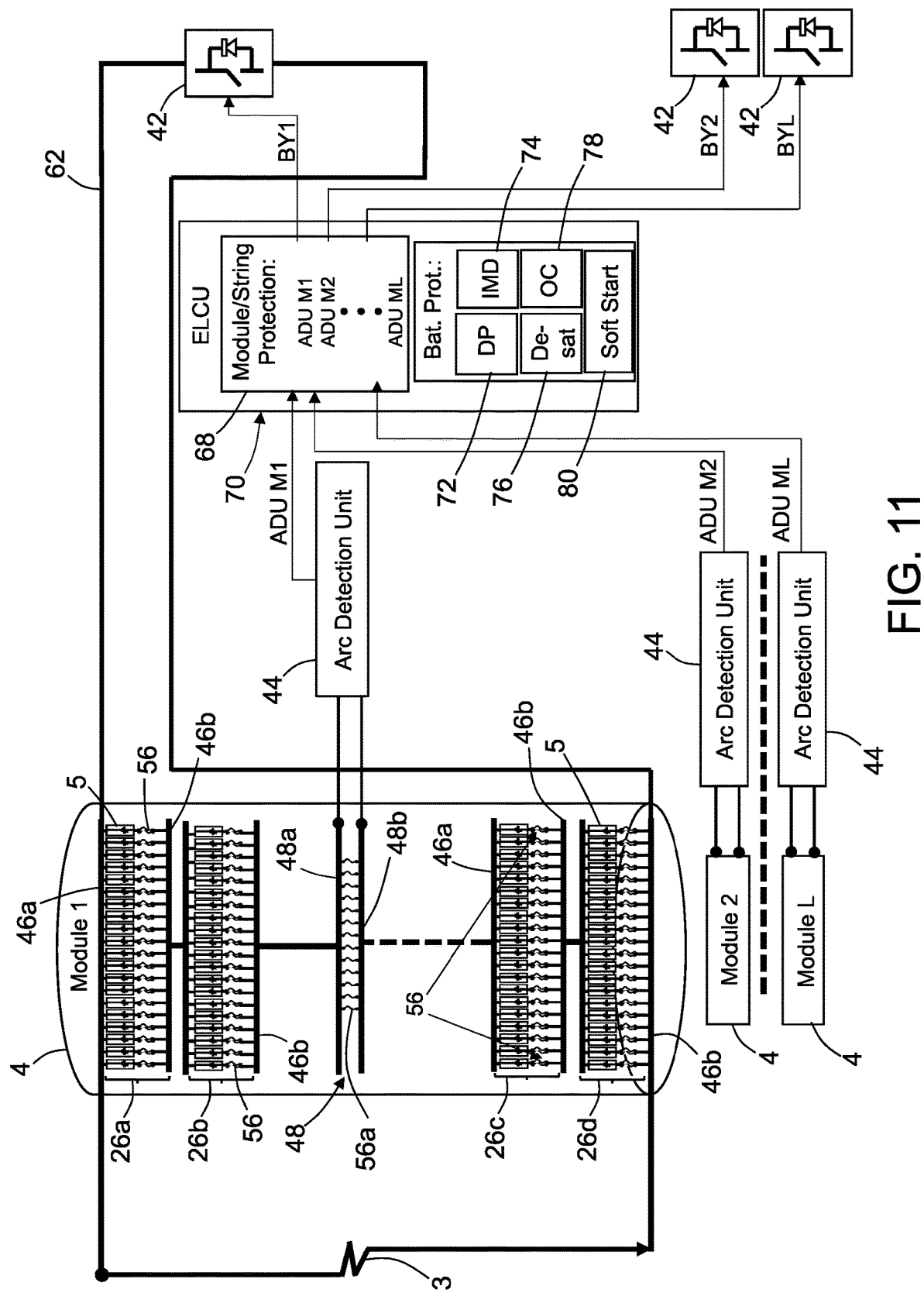
FIG. 11 is a diagram representing a string of battery modules and apparatus for detecting an arc across weakened fusible links in a dedicated bus of one or more battery modules and then bypassing those battery modules in accordance with another embodiment.

FIG. 10 depicts a battery module 4 in which the cells of virtual cell 26a are electrically connected to the cell busbar 46b of virtual cell 26a via a plurality of weakened fusible links 56a. The links may be connected to the cathode or the anode or both sides of the individual cells. In contrast, the system depicted in FIG. 11 includes battery modules having weakened fusible links 56a that connect busbars 48a and 48b of a dedicated bus 48. The bypass switches 42 and ELCU 70 shown in FIG. 11 are the same (and operate in the same way) as described with reference to FIG. 10, but the battery modules 4 and associated ADUs 44 are different. Instead of the ADUs 44 being connected to cell busbars 46a and 46b of virtual cells, the ADUs 44 are connected to busbars 48a and 48b of respective dedicated buses 48.

As seen in FIG. 11, each battery module includes four virtual cells 26a-26d and a dedicated bus 48 electrically connected in series between virtual cells 26b and 26c. The busbars 48a and 48b of dedicated busbar 48 are electrically connected to each other via a plurality of weakened fusible links 56a. Thus, during normal operation, current flows in sequence through virtual cell 26d, virtual cell 26c, dedicated bus 48, virtual cell 26b, and virtual cell 26a. However, in response to an external short circuit across the anode and cathode of the battery module 4, the weakened fusible links 56a are blown before the non-weakened fusible links 56 blow. This produces an arc across busbars 48a and 48b of the dedicated bus 48, which arc is detected by the associated ADU 44.

The number of weakened fusible links 56a across dedicated busbar 48 may be equal to the number of non-weakened fusible links 56 across each virtual cell. However, in alternative implementations, the number of weakened fusible links 56a across dedicated busbar 48 may be fewer than the number of non-weakened fusible links 56 across each virtual cell, as shown in FIG. 11.

In accordance with an alternative proposed implementation not depicted in the drawings, the dedicated bus 48 may be designed with non-weakened fusible links 56 instead of weakened fusible links 56a, provided that the number of non-weakened fusible links 56 across dedicated busbar 48 is sufficiently less than the number of non-weakened fusible links 56 across each virtual cell that the non-weakened fusible links across dedicated busbar 48 blow before the non-weakened fusible links across the virtual cells blow. As a result, the fewer non-weakened fusible links would clear a fault across busbars 48a and 48b, and therefore across the battery module 4, faster than would the greater number of non-weakened fusible links across a virtual cell. In this case, the non-weakened fusible links would have the same length and cross section, but the short-circuit current would be distributed across fewer fusible links. Therefore, each non-weakened fusible link of the dedicated bus 48 would see higher short-circuit. current and all links would open faster than the non-weakened fusible links of the virtual cells. The process of selection of the number of fusible links is also based on the Onderdonk equation and is intended to be carried out in the following way:

The time of arcing $t_a$ is proportional to the square of the ratio of the cross section A of the fusible link to the current I flowing through the fusible link:

$$t_a \propto (A/I)^2$$

One may assume that the lengths of the fusible links in the battery module are equal and calculated based on Eq. (2) to ensure that the voltage drop is sufficient to extinguish the arc. One may also assume (for a better commonality) that the cross sections of all fusible links are the same. One may then calculate the number of fusible links across each dedicated bus based on the new requirement for $t_a$. For example, if the new arcing time $t_{a\_new}=0.5t_a$, then:

$$0.5 = \left(\frac{I_a}{I_{a\_new}}\right)^2 \rightarrow T_{a\_new} = \frac{I_a}{0.5^{0.5}} = \frac{I_a}{0.707}$$

and therefore the new number of fusible links in the dedicated bus 48 should be 0.707 times the number of fusible links across a virtual cell. For example, if there are N=20 parallel cells with 20 fusible links in each virtual cell, then the number of fusible links across the dedicated bus 48 should be 14 in order to reduce the time of arcing by 50% (compared to the time of arcing across a virtual cell). In the generalized way, the number F of the fusible links across the dedicated bus may be determined using the following equation:

$$F = \frac{N}{\left(\frac{r_a}{r_{a\_new}}\right)^2} \quad (6)$$

The apparatus depicted in FIG. 11 operates as follows. An ADU 44 detects a fault (see FIGS. 12 and 13 for details). The ADU 44 reports the fault to the ELCU 70. The ELCU 70 engages (closes) the associated bypass switch 42 to bypass the entire battery module 4 to enable the battery string's current to continue to flow. Other battery modules, if affected, also report arcs across their fusible links to the ELCU 70. The ELCU 70 commands affected battery modules 4 to bypass themselves (by closing their bypass switches 4).

Figure 12:
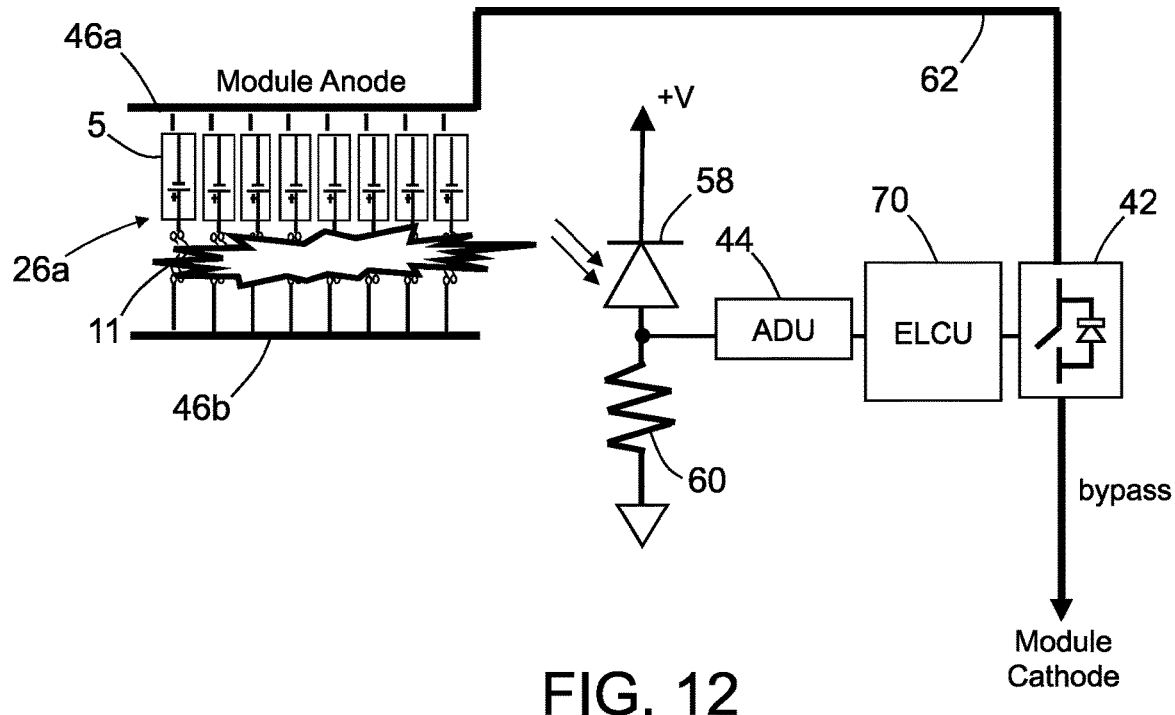
FIG. 12 is a diagram representing a virtual cell having an arc across weakened fusible links, apparatus for optically detecting the arc, and apparatus for bypassing the battery module in which the arc-afflicted virtual cell resides.

FIG. 12 is a diagram representing a virtual cell 26a having an arc 11 across weakened fusible links (not visible in FIG. 12), apparatus for optically detecting the arc, and apparatus for bypassing the battery module 4 in response to detection of the arc 11. The optical arc detection apparatus includes a photodetector 58 and an ADU 44 (or structural equivalents thereof). The photodetector 58 detects light emitted by arc 11 and outputs an electrical signal to the ADU 44 indicating the emitted light intensity. The ADU 44 is configured to detect when the electrical signal from photodetector 58 indicates intensity in excess of a specified threshold, which threshold has been previously established by experiment and calibration. The module bypassing apparatus includes the ELCU 70 and a bypass switch 42 (or structural equivalents thereof). As previously described, ADU 44 is configured to detect arc 11 across electrodes 9 of the blown fusible link and report the fault to ELCU 70 via a signal line. In response to any status signal from ADU 44 indicating the presence of arc 11 across pairs of electrodes 9 respectively connected by the weakened fusible links inside battery module 4, the ELCU 70 activates bypass switch 42 to close, thereby bypassing the entire battery module 4.

The photodetector 58 may be a photodiode or a phototransistor. In one proposed implementation, the cathode of the photodetector 58 is connected a voltage supply (+V) and the anode of the photodetector 58 is connected to the ADU 44. A resistor 60 is disposed between the anode of photodetector 58 and ground. Optionally, photodetector 58 may be optically coupled with a light pipe (not shown in FIG. 12). The light pipe (e.g., an optical fiber) may be configured to receive light from arc 11 and then transmit the captured light along the length of the light pipe and onto the photodetector 58.

Figure 13:
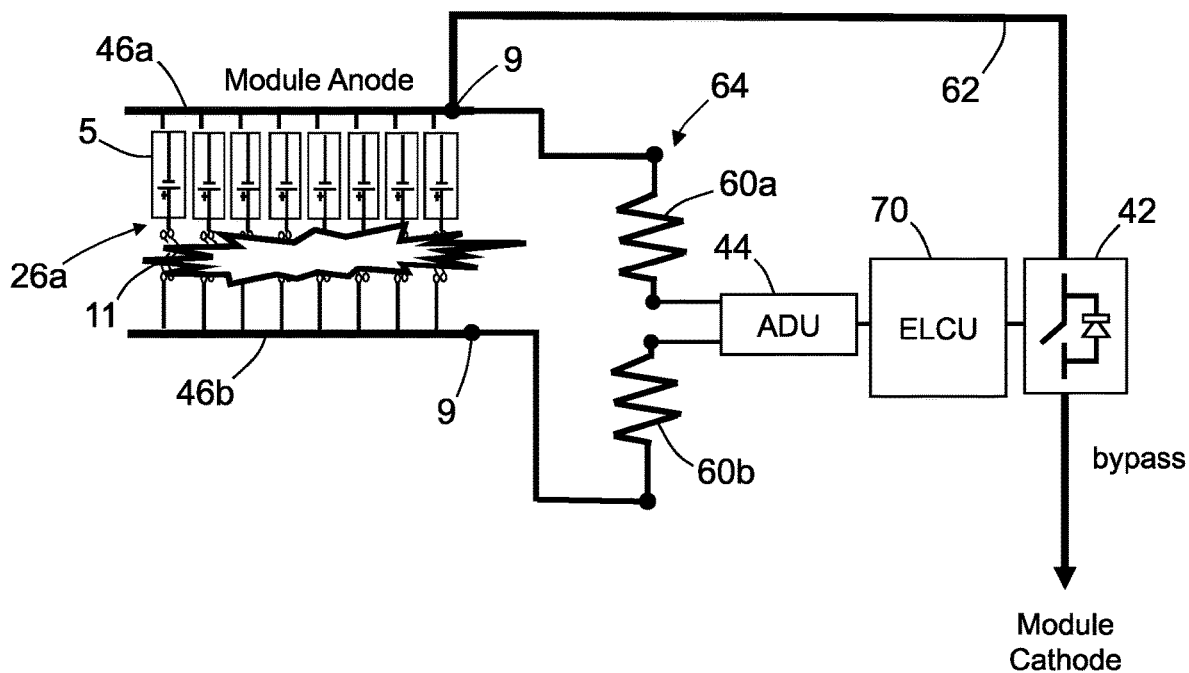
FIG. 13 is a diagram representing a virtual cell having an arc across weakened fusible links, apparatus for detecting the arc by voltage sensing, and apparatus for bypassing the battery module in which the arc-afflicted virtual cell resides.

FIG. 13 is a diagram representing a virtual cell 26a having an arc 11 across weakened fusible links (not visible in FIG. 12), apparatus for detecting an arc using voltage sensing, and apparatus for bypassing the battery module 4 in response to detection of a voltage that indicates the presence of an arc. The arc detection apparatus includes a resistive voltage divider 64 and an ADU 44 (or structural equivalents thereof). The resistive voltage divider 64 includes a pair of resistors 60a and 60b with relatively high values of resistance to limit ADU input current, which are respectively connected to cell busbars 46a and 46b of virtual cell 26a at electrodes 9 and which are additionally connected to inputs of the ADU 44. In response to detection of a voltage difference greater than a specified threshold, the ADU 44 is configured to report the fault to ELCU 70. In response to a status signal from ADU 44 indicating the presence of arc 11, the ELCU 70 activates the bypass switch 42 to close.

Figure 14:
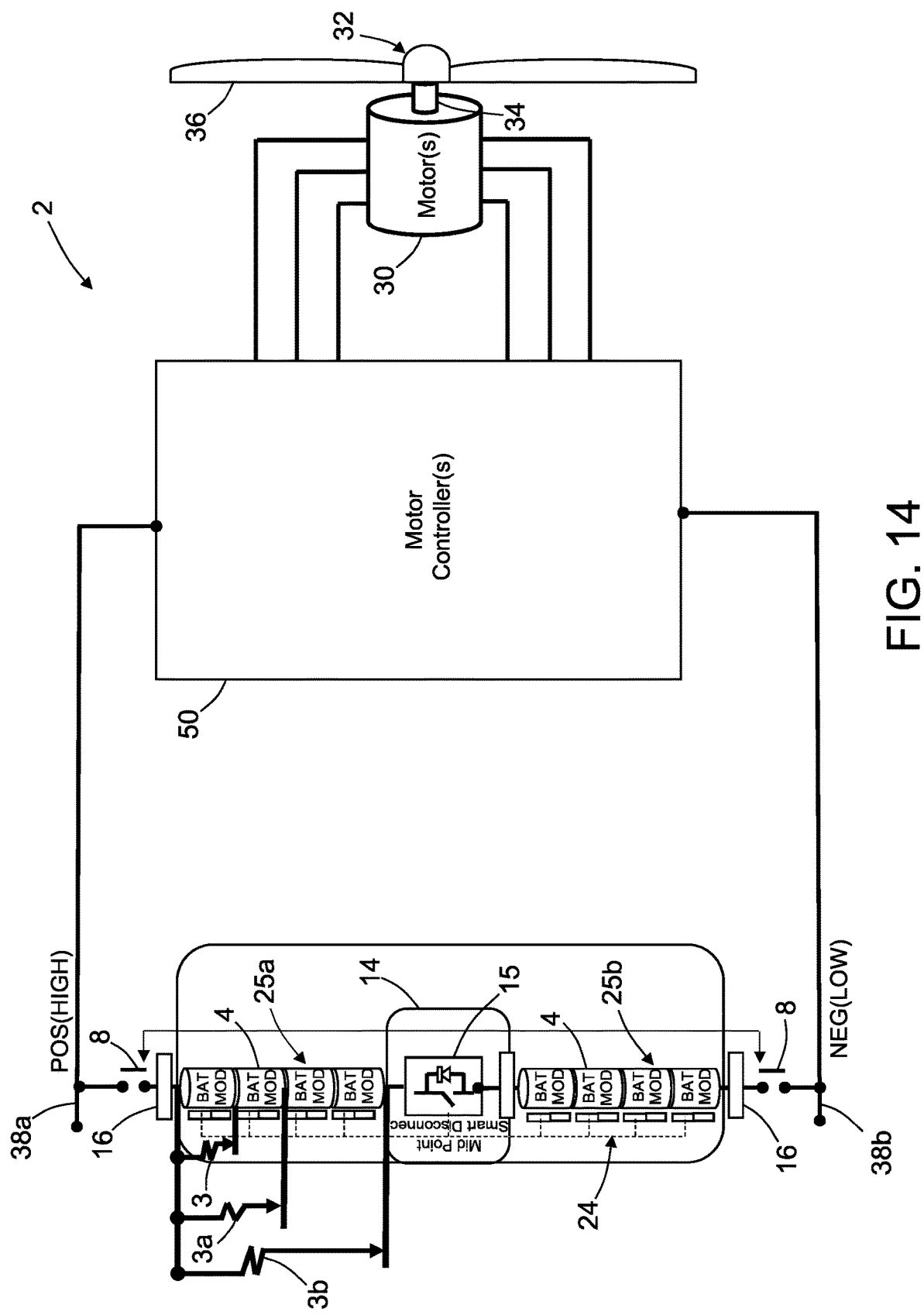
FIG. 14 is a diagram representing an aerospace electric propulsion system architecture with a single propulsor powered by a battery system comprising a plurality of eight-module battery strings (only one battery string is shown) connected in parallel across a pair of battery busbars, including three fault scenarios respectively involving one, two, and four battery modules of one half-string separated from another half-string by a mid-point battery disconnect subsystem.
Figure 15:
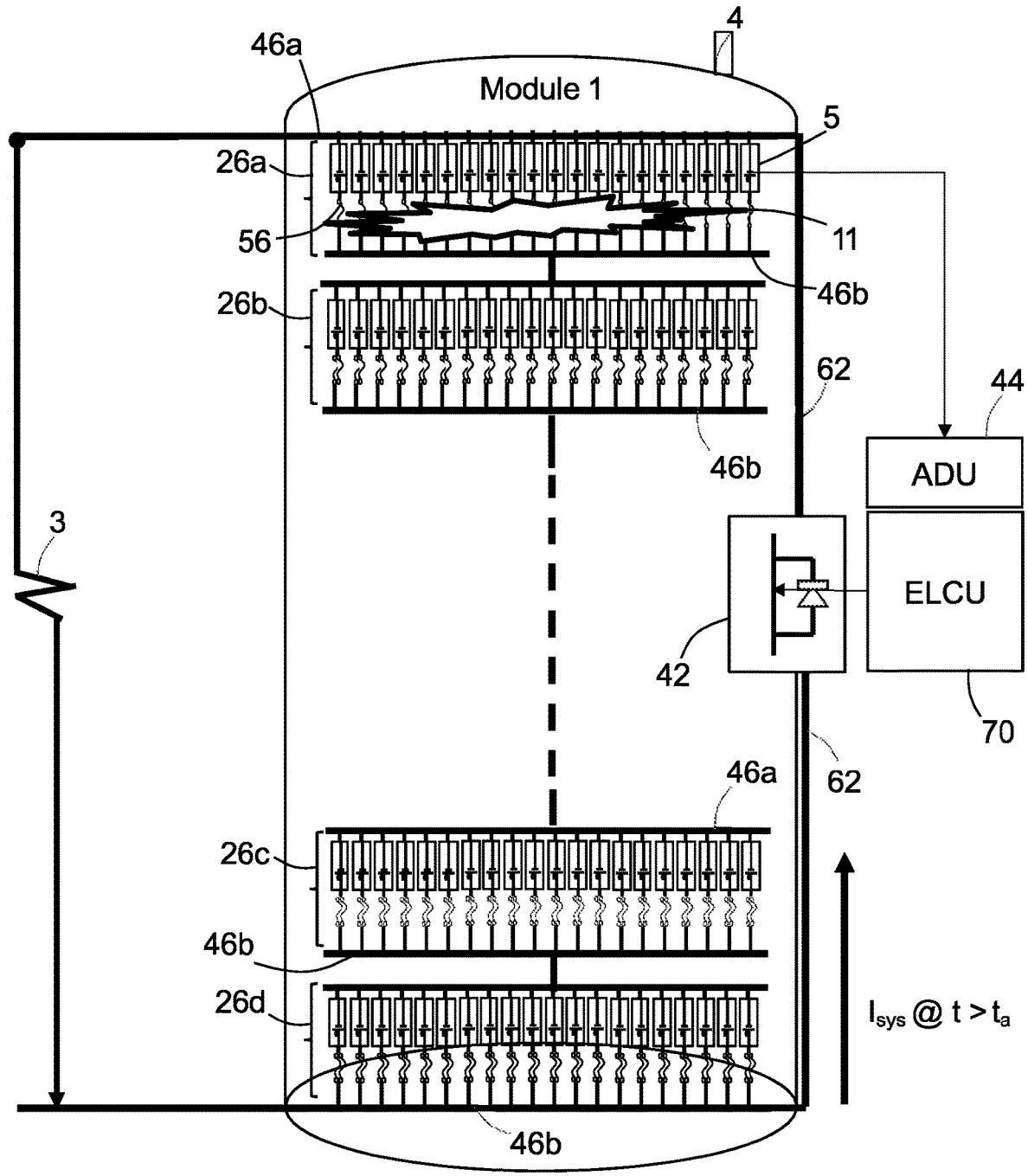
FIG. 15 is a diagram representing a single shorted battery module scenario in which an arc has been initiated across weakened fusible links in one virtual cell. The diagram also identifies associated apparatus for detecting the arc and bypassing the battery module.
Figure 16:
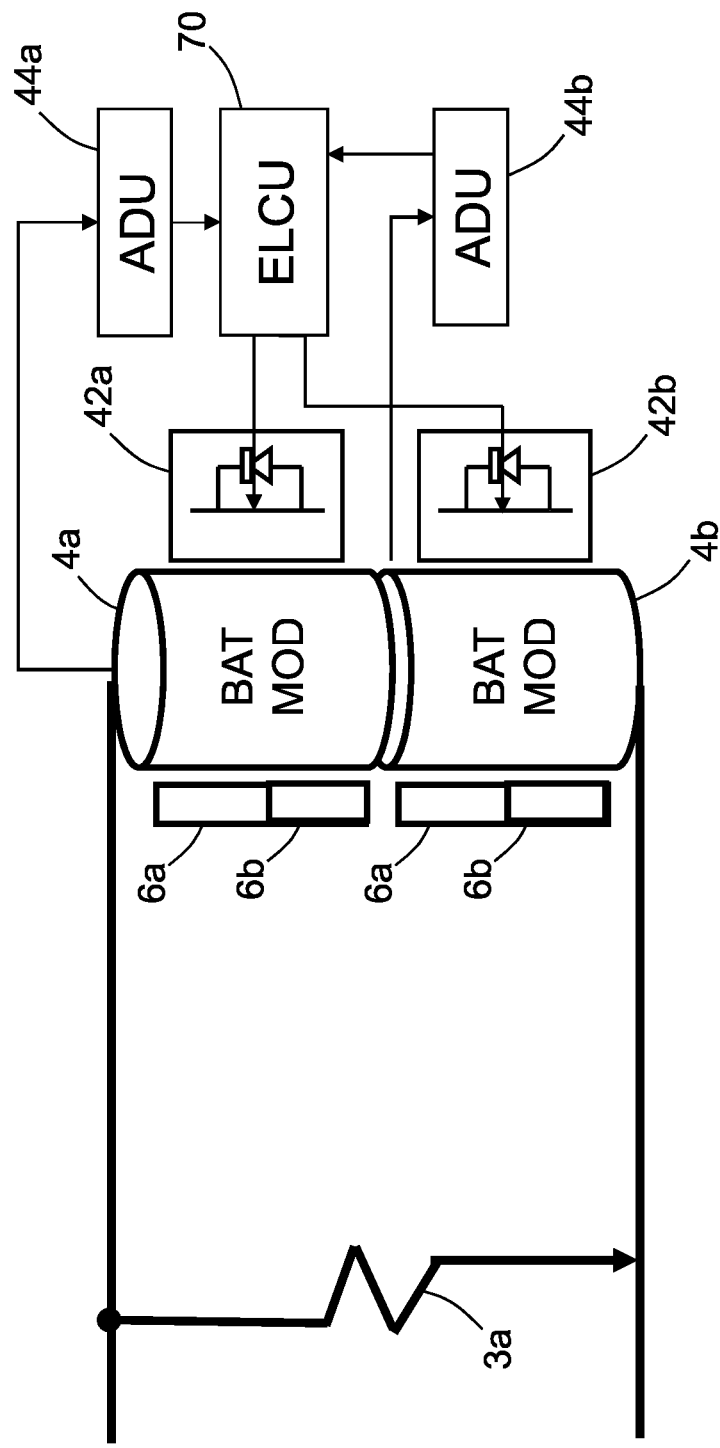
FIG. 16 is a diagram representing a two battery modules shorted scenario in which respective arcs exist across weakened fusible links in one virtual cell of each battery module. The diagram also identifies associated apparatus for detecting the arcs and bypassing both battery modules.
Figure 17:
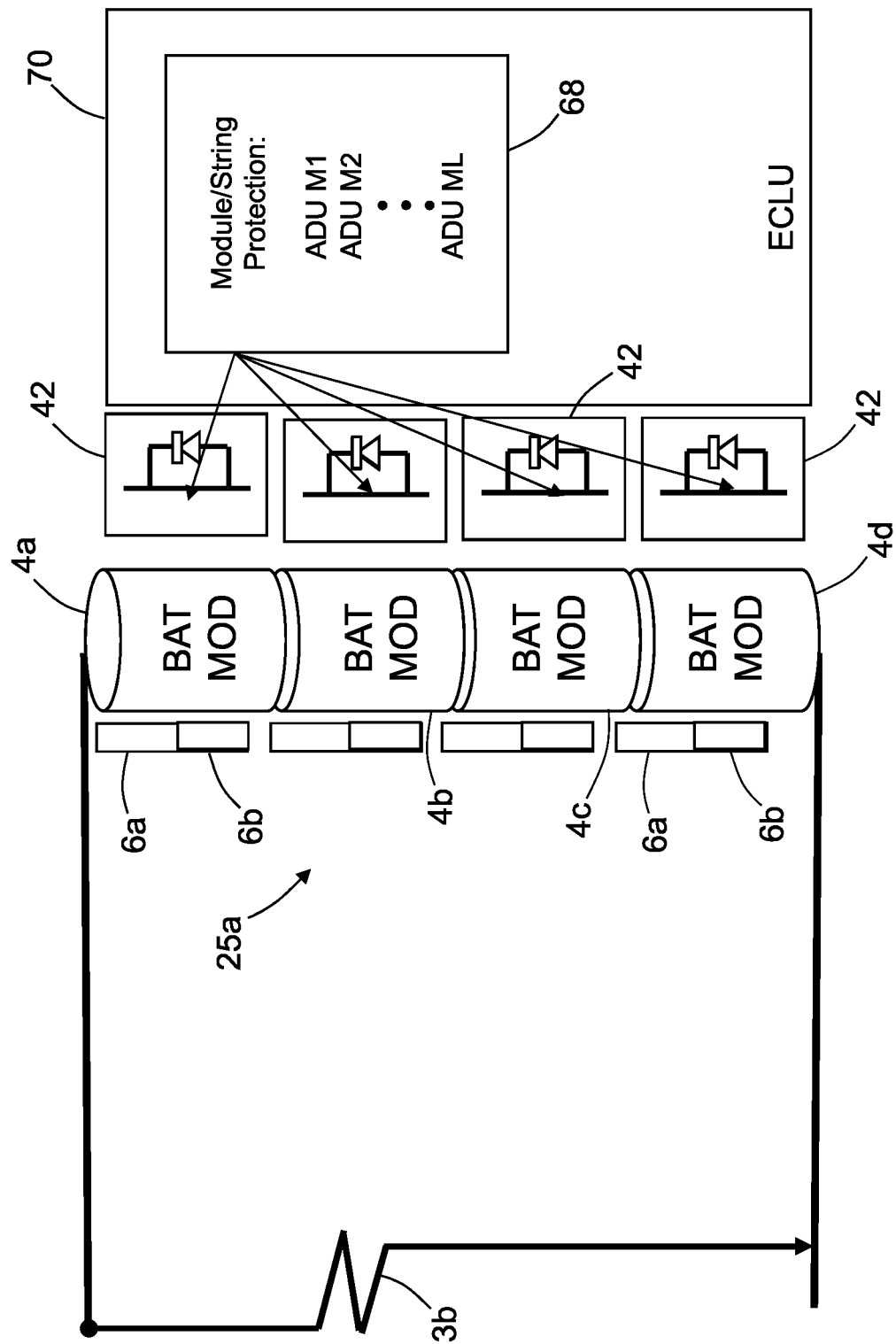
FIG. 17 is a diagram representing a scenario in which a fault has occurred across four battery modules of a half-string with subsequent arcs created across weakened fusible links in each battery module.
Figure 18:
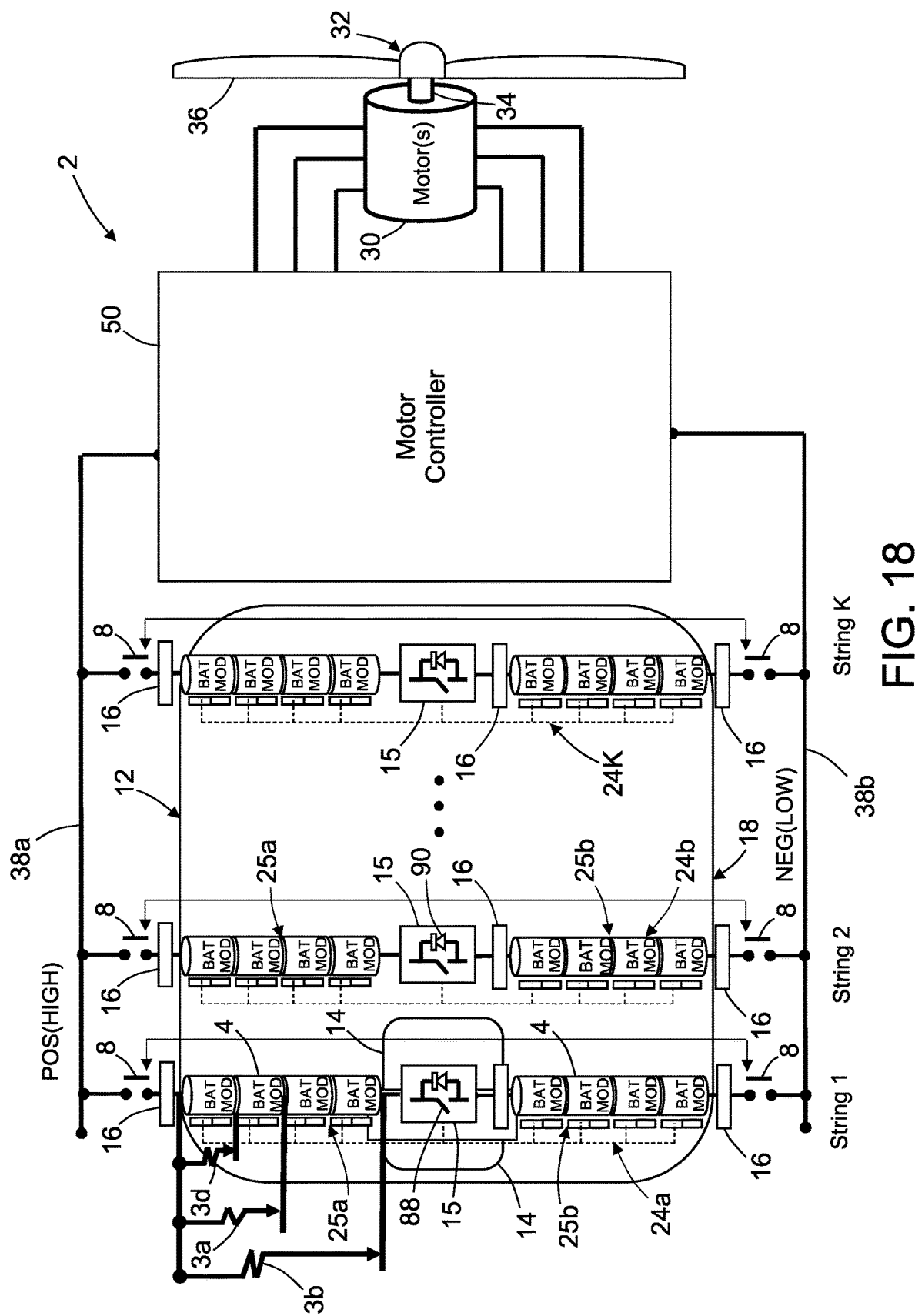
FIG. 18 is a diagram representing an aerospace electric propulsion system architecture with a single propulsor powered by a battery pack comprising a plurality of eight-module battery strings connected in parallel across positive and negative battery busbars, including three fault scenarios in the first battery string respectively involving one, two, and four battery modules of one half-string.

A further aspect of the innovative technology disclosed herein is the provision of means and methods for reconfiguration of the battery system after clearing a fault in various situations (as seen in FIG. 14). One situation is when a single battery module in a battery string has shorted (as seen in FIG. 15); another situation is when multiple battery modules in a battery string have shorted (as seen in FIG. 16); and a further situation is when a half-string has shorted (as seen in FIG. 17). These same situations affecting a single faulty battery string may require a more complicated response in a battery pack 18 having additional battery strings connected in parallel with the faulty battery string (as seen in FIG. 18).

FIG. 14 is a diagram representing an aerospace electric propulsion system 2 powered by a battery system comprising a plurality of eight-module battery strings (only one battery string 24 is shown in FIG. 14) connected in parallel across a pair battery busbars 38a and 38b. FIG. 14 also includes symbology representing three alternative fault scenarios respectively involving one, two, and four battery modules of one half-string 25a. The one half-string 25a is connected to the other half-string 25b via a mid-point battery disconnect subsystem 14. FIG. 14 shows three types of external faults which may occur in battery string 24: (a) a fault 3 across a single battery module 4; (b) a fault 3a across two adjacent battery modules 4; and (c) a fault 3b across one-half-string 25a (four battery modules). In these situations, mid-point battery disconnect subsystem 14 does not provide protection against any of faults 3, 3a, and 3b, but the battery module bypass subsystems depicted in FIGS. 10 and 11 provide protection to fault-free battery modules 4 in battery string 24 which are still operational. After the fault-affected battery modules in battery string 24 have been bypassed, measures are invoked for reconfiguring the battery system to resume operation without power from bypassed battery modules.

FIG. 15 is a diagram representing a single shorted battery module scenario in which an arc 11 has been initiated across weakened fusible links in one virtual cell 26a in response to fault 3 (e.g., a short across the anode and cathode of battery module 4). The battery protection system (depicted at a high level in FIG. 15) includes the previously described ADU 44, ELCU 70, and bypass switch 42.

In accordance with one possible scenario, the sequence of events may be as follows. First, the fault 3 occurs across the cell busbar 46a of virtual cell 26a and the cell busbar 46b of virtual cell 26d (which cell busbars are the anode and cathode respectively of battery module 4). The weakened fusible links in virtual cell 26a open after $t_a$, which is the arcing time needed to extinguish the arc as calculated by the Onderdonk equation (see comments to FIG. 9). The flash of arc 11 is detected by the ADU 44 and reported to the ELCU 70, which maintains a log containing digital data recording arcing events, including time stamps. After a time delay needed to verify that the arc 11 has extinguished, the ELCU 70 commands the bypass switch 42 to close, thereby establishing a bypassing path 62 for the flow of current between the anode and cathode of battery module 4. The bypass switch 42 may be implemented as a solid-state device, in which case bypass switch 42 would have the capability to provide a soft start in its linear region of operation if needed.

After the bypass switch 42 has been closed, the system current $I_{sys}$ flows along the bypassing path 62 to the load (not shown in FIG. 15). This configuration practically does not require that the fault 3 be completely cleared: the impedance of the bypass is very low and the bypassing path 62 is designed to support full load current with required overload. With one battery module 4 in one battery string 24 bypassed, the DC voltage provided by the entire battery pack is lower by the product of the number of series-connected virtual cells in one module multiplied by the voltage of a single virtual cell. This information is recorded and processed by the ELCU 70 and may be used for mission planning purposes.

FIG. 16 depicts a scenario in which a fault 3a has occurred across connected battery modules 4a and 4b (e.g., from the anode of battery module 4a to the cathode of battery module 4b). Respective arcs (not shown in FIG. 16) may be initiated across weakened fusible links inside battery modules 4a and 4b in response to fault 3a. The battery protection system (depicted at a high level in FIG. 16) includes an ADU 44a that detects the arc in battery module 4a, a bypass switch 42a that is connected (connections not shown in FIG. 16) to the anode and cathode of battery module 4a, an ADU 44b that detects the arc in battery module 4b, a bypass switch 42b that is connected to the anode and cathode of battery module 4b, and ELCU 70 which is connected to ADUs 44a and 44b.

The system designer needs to account for variability in the time needed by the weakened fusible links to clear the fault 3a (hereinafter "clearing time") inside two battery modules sequentially and independently. One may assume without loss of generality that the fusible link of battery module 46a has marginally higher resistance and starts arcing earlier than battery module 4b does. In this instance, the weakened fusible links in battery module 4a blow open before the fault current is interrupted in battery module 4b. The weakened fusible links in battery module 4a blow open after time $t_{a1}$. If the short is still present at the location of fault 3a, it becomes the path for the load current, but the system voltage is lower by a value equivalent to the voltage produced by battery module 4a. If, however, the fault 3a is extinguished simultaneously with opening of the weakened fusible links inside battery module 4a, the system current $I_{sys}$ is also interrupted.

The arc flash inside battery module 4a is detected by ADU 44a and reported to ELCU 70. After a time delay needed to verify that the arc is extinguished, the ELCU 70 commands the bypass switch 42a associated with battery module 4a to close. If, as mentioned earlier, fault 3a is extinguished, then the closure of bypass switch 42a re-establishes the system current and the battery string continues its normal operation at the reduced voltage level in the same way as was previously described with reference to FIG. 14. If fault 3a is still present, then the act of bypassing battery module 4a re-establishes a high short-circuit current across battery modules 4a and 4b. Now, the state of the battery string is that battery module 4a has been bypassed and the fault current is supported by battery module 4b.

Due to the continued presence of fault 3a, the weakened fusible links in battery module 4b eventually also blow open, but after the weakened fusible links in battery module 4a have already blown. The weakened fusible links in battery module 4b blow open after an additional clearing time $t_{a2}$ (measured from the end of clearing time $t_{a1}$). If the short is still present at the location of fault 3a, it remains the path for the load current, but the system voltage is lower by a value equivalent to the voltage produced by the two battery modules 4a and 4b. If, however, the fault 3a is extinguished simultaneously with opening of the weakened fusible links inside battery module 4b, the system current $I_{sys}$ is also interrupted.

The arc flash inside battery module 4b is detected by ADU 44b and reported to ELCU 70. After a time delay needed to verify that the arc is extinguished, the ELCU 70 commands the bypass switch 42b associated with battery module 4b to close. If fault 3a has been extinguished, then the closure of bypass switch 42b re-establishes the system current and the battery string continues its normal operation at a voltage level which is reduced by a value equal to two times the nominal voltage across each battery module. If fault 3a is still present, then the act of bypassing battery module 4b re-establishes a high short-circuit current across battery modules 4a and 4b. Now, the state of the battery string is that battery modules 4a and 4b have both been bypassed. The ELCU 70 now contains information that in a particular battery string, two battery modules are out and bypassed, and the system voltage is lower than expected by the voltage produced by two battery modules. The total time needed to clear the fault 3a is the sum of $t_{a1}$ and $t_{a2}$.

FIG. 17 is a diagram representing a scenario in which a fault 3b has occurred across four battery modules 4a-4d of a half-string 25a, with successive (or simultaneous) arcs being created across weakened fusible links in each battery module. FIG. 17 also shows associated bypass switches 42 having switch states controlled by the ELCU 70 (the ADUs are not shown to avoid clutter in the drawing).

Still referring to FIG. 17, the short across half-string 25a may be cleared in each battery module (in succession) by the same sequence (within each battery module) of blowing fusible links open, detecting the arc, and closing bypass switch 42. In this case, the voltage across the battery string is exactly ½ of the nominal battery string voltage and the time needed to clear the fault is $\Sigma_i^L = 1 t_{ai}$, where L is the number of series-connected modules affected by the fault (four in FIG. 17). The order in which successive modules are bypassed is not essential. Upon completion of the system response to the scenario depicted in FIG. 17, the ELCU 70 contains information about the half-string 25a being off and coordinates with the other power sources and loads as explained below.

In accordance with another proposed implementation, the ELCU 70 may coordinate activation of other protection elements of the circuit (e.g., open the mid-point disconnect contactor 66 seen in FIG. 2) in response to the fault condition detected by ADU 44 or other elements of protection (which can detect, but cannot clear faults inside the half-string 25a, e.g., under-voltage protection) to ensure that the battery string does not reconnect automatically. In this mode of operation, reconnecting can be done only by a command provided by ELCU 70.

Implementation of the string shown in FIG. 14 suggests that for an architecture having a mid-point battery disconnect subsystem 14, the maximum length of the weakened fusible links should be calculated based on the number (L) of battery modules which are potentially affected by a fault not exceeding ½ of the total number of battery modules 4 in the battery string 24. This is supported by the philosophy of coordination between different protection elements of the system: Mid-point disconnect is activated first in response to a fault external to the BPDU 12 and is backed by the string contactors 8 seen in FIG. 14. While weakening one set of fusible links and implementing bypassing of the modules mitigates shorts across one or more battery modules of a half-string, their activation time is required to be significantly slower (hundreds of milliseconds), as compared to the mid-point disconnect activation timing (milliseconds) and one of the string contactors 8 (tens of milliseconds).

FIG. 18 is a diagram representing an aerospace electric propulsion system architecture with a single propulsor powered by a battery pack 18 comprising a plurality of battery strings 24a, 24b, . . . , 24K connected in parallel across positive and negative battery busbars 38a and 38b. FIG. 18 shows three fault scenarios in battery string 24a (hereinafter "faulty battery string 24a") respectively involving one, two, or four battery modules 4 of one half-string 25a.

In accordance with a further aspect of the innovative technology proposed herein, means and methods are provided for solving the problem of reconnecting a faulty battery string 24a after the fault has been cleared if a mission requires completion or continuation when the power loss due to bypassing is less than the nominal power of one entire battery string. Fault detection and especially isolation for this scenario involving multiple parallel strings is different from the case when a single string provides power to a single load or plural loads.

The difference is related to the fact that paralleled battery strings tend to equalize their output voltage and circulating currents would flow if one of the strings were to reconnect immediately after clearing a fault with reduced number of modules connected in series. The most straightforward mitigation of this risk is to use blocking diodes, but for the practical level of power flow in the system (from hundreds of kilowatts to megawatts), the diodes would: (a) be heavy, (b) reject hundreds of watts to kilowatts of heat that has to be managed by an additional heat dumping/cooling system, and (c) require bypass circuitry for the normal battery charging operations. All this would significantly decrease system efficiency and complicate the design. But even then, the battery string would not be able to provide power at a reduced level because voltage at the diode's cathode will be higher than the voltage at its anode and therefore a diode will stay closed until the voltage level of paralleled unaffected strings drops down naturally below the level of the remaining series-connected modules in the faulty battery string 24a.

In accordance with one proposed embodiment, a concept of a "virtual" diode is implemented such that the faulty battery string 24a is first disconnected from the system and then connected back only after the ELCU 70 receives information from BPMS 22 that the system voltage of the unaffected battery strings has dropped down below the voltage of the remaining healthy battery modules of the faulty battery string 24a. As mentioned above, the BPMS 22 is communicatively coupled to all mid-point battery disconnect subsystems 14 for coordination purposes and has overarching control. Information from each individual ELCU is routed into a master controller of the BPMS 22. This communication may be bidirectional, which enables the BPMS 22 to inform the ELCU 70 regarding the voltage of the remaining healthy battery strings.

This process may be explained with reference to FIG. 18. First, a fault 3, 3a, or 3b occurs across one or more battery modules 4 in half-string 25a of faulty battery string 24a. The fault is detected by either an over-current protection module through the current sensor 16 (e.g., a Hall Effect current sensor) on the positive side of the battery pack 18 (in this example) and/or by voltage protection inside the ELCU 70 (not shown in FIG. 18) as a voltage across affected module(s) and across the entire string collapses to levels significantly lower than the nominal voltage. During the fault, the current sensor 16 of the affected-by-the-fault string, connected to the buses 38a and 36b, may sense a large negative current because unaffected battery strings 24b through 24K will supply current to the faulty battery string 24a to equalize the voltages of all strings.

When there is a fault across a module, the voltage across the module collapses to nearly zero. The sensing circuit may be implemented as resistive voltage dividers connected to the differential protection module 72 (see FIG. 10). In the case of a short circuit, voltages at the high and low sides of a battery module would be read by the differential protection module 72 as being nearly the same values—which is contrary to the normal operations case wherein the voltage is $M \times V_{cell}$, where M is the number of virtual cells in the module and $V_{cell}$ is the voltage of a cell (typically, several tens of volts; likely less than 100 V).

Upon detecting under-voltage or over-current, the ELCU 70 is commands the mid-point disconnect circuit 15 of faulty battery string 24a to open. As a redundant level, string contactors 8 between faulty battery string 24a and battery busbars 38a and 38b are also commanded to open by ELCU 70 at the same instance. These steps are independent from the processes described with reference to FIGS. 14-17 and are executed within a one- to several-millisecond timeframe. This time is not sufficient for the weakened fusible links of the affected module(s) to blow open and clear the fault. However, it is important to isolate faulty battery string 24a quickly because if the other parallel battery strings 246b through 24K supply their current to faulty battery string 24a, this may cause thermal damage to the battery cells of all battery strings, thermal damage at the location of the fault, and unpredictable voltage instabilities in the system.

Upon disconnecting the faulty battery string 24a, the weakened fusible links inside the fault-affected battery modules 4 will blow after a clearing time $t_a$ and the same sequence of operations is executed as was described with reference to FIGS. 13-15. After the MOSFET 88 has been opened, the voltage drop across S fault-affected battery modules is $M \times S \times V_{res\_cell}$ due to the fact that the voltage loop now is defined as a closed one across only the S battery modules that have been bypassed due to the fault. However, if the design satisfies Eq. (2) with L modules connected in series, it will automatically satisfy Eq. (2) for S modules since $S \leq L/2$. This can be a distinguishing point between the design of a system with a single battery string for one or more loads and when multiple battery strings are paralleled. Then the following steps are performed: (1) each ADU 44 detects the fusible link arcs and reports their occurrence to ELCU 70; (2) after a timeout, the ELCU 70 commands the bypass switch(es) 42 to open; and (3) the bypassing path 62 is ready to provide current to the load. It is important to note that at this point the faulty battery string 24a is still disconnected from the rest of the electrical system. The procedure for reconnecting the healthy battery modules of faulty battery string 24a will now be described with reference to FIG. 19.

Figure 19:
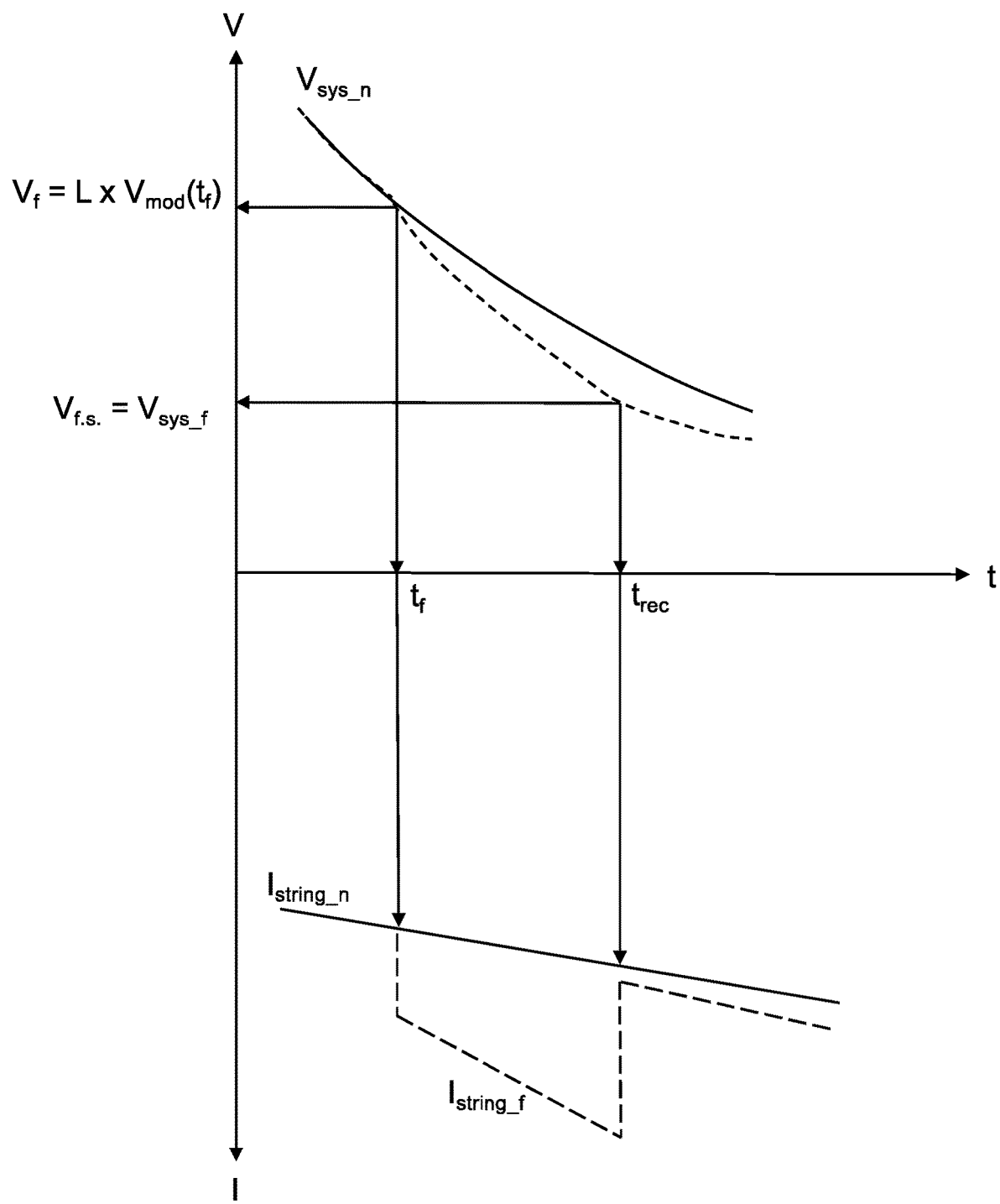
FIG. 19 is a graph showing the voltage and current of a battery system having multiple battery strings versus time during normal (undisturbed) operation (solid lines) and during initiation of a fault in one battery string, isolation of the faulted battery modules in the one battery string, and subsequent reconnection of the healthy battery modules of the one battery string (dashed lines).

FIG. 19 is a graph showing the voltage and current of a battery system having multiple battery strings versus time during normal (undisturbed) operation (solid lines) and during initiation of a fault in one battery string, isolation of the faulted battery modules in the one battery string, and subsequent reconnection of the healthy battery modules of the one battery string (dashed lines).

FIG. 19 indicates timely coordinated reconnect of the faulted battery string after the fault has been cleared by blowing the weakened fusible links of one or more battery modules and closing the associated bypass switch(es). For simplicity and for demonstration of the principal purpose, the voltage of the faulted string ($V_{FS}$) at the moment of the fault is equal to the difference between the system's voltage (measured across the battery busbars) at the moment of fault ($V_f$) and a voltage equal to $S \times V_{mod}$ at the same moment. Here $V_{mod}$ is the voltage produced by a single module and S is the number of fault-affected battery module(s) in a faulty battery string, S=1, . . . , L/2. After this moment of the fault, the system voltage becomes $V_{sys\_f}$ (dashed curve in FIG. 19) and generally drops faster than the system voltage $V_{sys\_n}$ under normal, undisturbed operation (solid line). The rate of change of voltage is defined by the number of parallel strings in the system (battery pack) and the individual string's current outputs, $I_{string\_n}$ (under normal operation) and $I_{string\_f}$ (when one string has a fault), to support power $V_{sys} \times \Sigma I_{string}$ required by a load(s). When the voltage $V_{FS}$ of the faulted string with S bypassed modules becomes equal to $V_{sys\_f}$, the faulty battery string can be reconnected, i.e., the time of reconnect $t_{rec}$ occurs when:

$$V_{FS}=(L-S) \times V_{mod}(t_f)=V_{sys\_f}$$

The reconnect routine to be programmed in the ELCU is based on the actual measurements of the voltage across the unaffected battery strings and across the individual modules in the faulted battery string. The reconnect at time $t_{rec}$ is performed by closing the string contactors 8 first and then by closing the mid-point disconnect contactor 66 (see FIG. 2) or MOSFET 88 (see FIG. 3). After removal of the fault has been verified, the system is operable under the reduced power condition.

Also, this disclosure does not address the problem of operating paralleled strings of cells with different states of charge, but with the same or nearly equal voltage across the strings; therefore all curves, their absolute values and slopes, and exact timing of transition are for the purpose of illustration only. All accompanying inefficiencies and associated effects on the system would be addressed after safe completion of the mission.

Certain systems, apparatus, applications or processes have been described herein as including a number of modules. A module may be a unit of distinct functionality that may be implemented in software, hardware, or combinations thereof, except for those modules which are preferably implemented as hardware or firmware to enable streaming calculations as disclosed herein. When the functionality of a module is performed in any part through software, the module can include a non-transitory tangible computer-readable storage medium.

The flowcharts and block diagrams in the different depicted embodiments illustrate the architecture, functionality, and operation of some possible implementations of apparatus and methods in an illustrative embodiment. In this regard, each block in the flowcharts or block diagrams may represent a is module, segment, function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams.

While apparatus and methods for mitigating abrupt release of energy in a battery pack due to a fault external to and across one or more battery modules have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore it is intended that the claims not be limited to the particular embodiments disclosed herein.

The electric propulsion controller, engine control unit (a.k.a. engine controller), inverter controllers, and electronic load control unit disclosed herein may be implemented using hardware or hardware in combination with software. For example, a controller or control module may be implemented using configurable hardware, a programmable device, or both. Configurable hardware may comprise hardware that is configurable to perform one or more functions of the controller. A programmable device may comprise any device that is programmable to implement one or more functions of the controller. For example, without limitation, the programmable device may comprise a central processing unit, a microprocessor, or a digital signal processor. The programmable device may be configured to run software or firmware in the form of program instructions is to implement one or more functions of the controller. Program instructions may be stored in any appropriate non-transitory tangible computer-readable storage medium for execution by, or transfer to, the programmable device.

In particular, the electronic load control unit (control module) disclosed herein is configured in accordance with control logic that includes one or more of the algorithms for providing the battery module protection and battery system reconfiguration disclosed herein. A control module may be a unit of distinct functionality that may be implemented in software, hardware, or combinations thereof. When the functionality of a control module is performed in any part through software, the module can include a non-transitory tangible computer-readable storage medium. The methods disclosed above may employ streaming (or on-the-fly) calculations, in which case the control module configured to perform those calculations is suitable for FPGA or ASIC or other hardware-based implementation.

The methods described and claimed herein may include steps encoded as executable instructions embodied in a non-transitory tangible computer-readable storage medium, including, without limitation, a storage device and/or a memory device. Such instructions, when executed by a processing or computing system, cause the system device to perform at least a portion of the methods described herein.

In the method claims appended hereto, any alphabetic ordering of steps is for the sole purpose of enabling subsequent short-hand references to antecedent steps and not for the purpose of limiting the scope of the claim to require that the method steps be performed in alphabetic order.

The invention claimed is:

1. A battery module comprising:
a first bus comprising a first busbar and a second busbar;
a first plurality of battery cells connected to the first busbar;
a plurality of weakened fusible links connected to the second busbar and respectively connected in series to the first plurality of battery cells;
a second bus comprising a third busbar connected to the second busbar and a fourth busbar;
a second plurality of battery cells connected to the third busbar; and a plurality of non-weakened fusible links connected to the fourth busbar and respectively connected in series to the second plurality of battery cells, wherein a first plurality of series connections formed by the first plurality of battery cells and the plurality of weakened fusible links are connected in parallel to the first and second busbars;

wherein a second plurality of series connections formed by the second plurality of battery cells and the plurality of non-weakened fusible links are connected in parallel to the third and fourth busbars; and wherein the weakened fusible links are configured to blow open prior to the non-weakened fusible links blowing open in case of a short circuit across an anode and a cathode of the battery module.

2. The battery module as recited in claim 1, wherein the weakened fusible links have a first opening time and the non-weakened fusible links have a second opening time longer than the first opening time.

3. The battery module as recited in claim 1, further comprising an arc detection apparatus positioned and configured to detect a presence of an arc across pairs of electrodes respectively connected by the weakened fusible links.

4. The battery module as recited in claim 3, further comprising a bypass switch connected to the anode and cathode of the battery module.

5. The battery module as recited in claim 3, wherein the arc detection apparatus comprises a photodetector.

6. The battery module as recited in claim 3, wherein the arc detection apparatus comprises a resistive voltage divider.

7. A battery system comprising:
positive and negative battery busbars;
a battery string comprising first and second half-strings which are connected in series across the positive and negative battery busbars, wherein the first half-string comprises a plurality of battery modules connected in series, each of the battery modules comprising an anode, a cathode, a plurality of virtual cells connected in series between the anode and cathode, the plurality of virtual cells comprising a first virtual cell comprising parallel battery cells connected to weakened fusible links and a second virtual cell comprising parallel battery cells connected to non-weakened fusible links, a bypass switch connected to the anode and cathode, and an arc detection apparatus positioned and configured to detect an arc in the first virtual cell; and
an electronic load control unit connected to each arc detection apparatus and to each bypass switch and configured to close the bypass switch of any battery module in which the arc detection apparatus outputs a status signal indicating the presence of an arc in the first virtual cell of the battery module.

8. The battery system as recited in claim 7, wherein the electronic load control unit comprises an over-current protection module.

9. The battery system as recited in claim 8, further comprising a mid-point disconnect circuit disposed between and connected to the first and second half-strings, wherein the electronic unit is connected to the mid-point load control disconnect circuit and further configured to open the mid-point disconnect circuit prior to closure of any bypass switch in response to detection by the over-current protection module of an over-current condition in the battery module.

10. The battery system as recited in claim 8, further comprising a string contactor disposed between and connected to the positive busbar and to the first half-string, wherein the electronic load control unit is connected to the string contactor and configured to open the string contactor prior to closure of any bypass switch in response to detection by the over-current protection module of an over-current condition in the battery module.

11. The battery system as recited in claim 7, wherein the electronic load control unit comprises a differential protection module.

12. The battery system as recited in claim 11, further comprising a mid-point disconnect circuit disposed between and connected to the first and second half-strings, wherein the electronic load control unit is connected to the mid-point disconnect circuit and further configured to open the mid-point disconnect circuit prior to closure of any bypass switch in response to detection by the differential protection module of an under-voltage condition in the battery module.

13. The battery system as recited in claim 11, further comprising a string contactor disposed between and connected to the positive busbar and to the first half-string, wherein the electronic load control unit is connected to the string contactor and configured to open the string contactor prior to closure of any bypass switch in response to detection by the differential protection module of an under-voltage condition in the battery module.

14. The battery system as recited in claim 7, wherein the weakened fusible links have a first opening time and the non-weakened fusible links have a second opening time longer than the first opening time.

15. A battery system comprising:
a pair of busbars;
a battery pack comprising a plurality of battery strings connected in parallel across the positive and negative busbars;
a plurality of string contactors disposed between and connected to one of the busbars and respective battery strings;
a plurality of electronic control units connected to respective battery strings; and
a battery pack management system which is communicatively coupled to the plurality of electronic control units,
wherein each battery string comprises first and second half-strings which are connected in series across the positive and negative battery busbars, and a mid-point disconnect circuit disposed between and connected to the first and second half-strings;
wherein the first half-string comprises a first plurality of battery modules connected in series and the second half-string comprises a second plurality of battery modules connected in series;
wherein each of the battery modules comprises an anode, a cathode, a plurality of virtual cells connected in series between the anode and cathode, the plurality of virtual cells comprising a first virtual cell comprising parallel battery cells connected to weakened fusible links and a second virtual cell comprising parallel battery cells connected to non-weakened fusible links, a bypass switch connected to the anode and cathode, and an arc detection apparatus positioned and configured to detect an arc in the first virtual cell; and
wherein each electronic load control unit is connected to each arc detection apparatus and to each bypass switch of a respective battery string and is configured to close the bypass switch of any battery module in which the arc detection apparatus outputs a status signal indicating the presence of an arc in the first virtual cell of the battery module.

16. The battery system as recited in claim 15, wherein each electronic load control unit comprises an over-current protection module and a differential protection module, is connected to a respective mid-point disconnect circuit and respective string contactor, and is further configured to open the mid-point disconnect circuit and the string contactor prior to closure of any bypass switch in response to either detection by the over-current protection module of an over-current condition or detection by the differential protection module of an under-voltage condition in the battery module.

17. The battery system as recited in claim 16, wherein each electronic load control unit is further configured to close the mid-point disconnect circuit and the string contactor subsequent to closure of one or more bypass switches when a system voltage of unaffected battery strings has dropped down below a voltage of remaining healthy battery modules of a faulty battery string.

18. A method for configuring a battery string which is electrically connected to a busbar when a string contactor is closed, the battery string comprising a pair of half-strings which are electrically connected in series when a mid-point disconnect circuit is closed, one of the half-strings being electrically connected to the busbar via the closed string contactor, and each of the half-strings comprising a respective plurality of battery modules connected in series, the method comprising:
  detecting an occurrence of an arc in a faulty battery module that is included in one of the pluralities of battery modules;
  closing a bypass switch that connects an anode and a cathode of the faulty battery module in response to detection of the arc; and
  opening the string contactor and the mid-point disconnect circuit prior to closing the bypass switch.

19. A battery module comprising:
a first bus comprising a first busbar and a second busbar;
a plurality of weakened fusible links connected in parallel to the first and second busbars;
a second bus comprising a third busbar connected to the second busbar and a fourth busbar;
a plurality of battery cells connected in parallel to the third busbar; and
a plurality of non-weakened fusible links connected to the fourth busbar and respectively connected in series to a plurality of battery cells,
wherein a plurality of series connections formed by the plurality of battery cells and the by the plurality of non-weakened fusible links are connected in parallel to the third and fourth busbars; and
wherein the weakened fusible links are configured to blow open prior to the non-weakened fusible links blowing open in case of a short circuit across an anode and a cathode of the battery module.

20. The battery module as recited in claim 19, further comprising an arc detection apparatus connected to the third and fourth busbars.

* * * * *